(12) United States Patent
Qi et al.

(10) Patent No.: US 7,873,339 B2
(45) Date of Patent: Jan. 18, 2011

(54) SYSTEM FOR DETERMINING TOTAL ISOTROPIC SENSITIVITY (TIS) USING TARGET RECEIVED SIGNAL STRENGTH INDICATOR (RSSI) VALUE AND RELATED METHODS

(75) Inventors: Yihong Qi, St. Agatha (CA); Michael Certain, Kitchener (CA); Qingmai Zhou, Waterloo (CA); Perry Jarmuszewski, Waterloo (CA)

(73) Assignee: Research In Motion Limited, Waterloo, Ontario (CA)

( * ) Notice: Subject to any disclaimer, the term of this patent is extended or adjusted under 35 U.S.C. 154(b) by 584 days.

(21) Appl. No.: 12/023,131

(22) Filed: Jan. 31, 2008

(65) Prior Publication Data
US 2008/0311871 A1 Dec. 18, 2008

Related U.S. Application Data

(60) Provisional application No. 60/944,250, filed on Jun. 15, 2007.

(51) Int. Cl.
*H04B 17/00* (2006.01)
(52) U.S. Cl. .................. 455/226.2; 455/63.13; 455/425
(58) Field of Classification Search .............. 455/63.11, 455/63.13, 63.14, 226.1–226.3, 423, 425
See application file for complete search history.

(56) References Cited

U.S. PATENT DOCUMENTS

| | | | |
|---|---|---|---|
| 6,308,065 B1 | 10/2001 | Molinari et al. | 455/424 |
| 6,587,671 B1 | 7/2003 | Kanago et al. | 455/67.1 |
| 6,839,657 B2 | 1/2005 | Verbeyst et al. | 702/182 |

(Continued)

FOREIGN PATENT DOCUMENTS

CA 2578310 3/2006

(Continued)

OTHER PUBLICATIONS

Foegelle, *Antenna Pattern Measurement: Theory and Equations*, Compliance Engineering 2002 Reference Guide, available at www.ce-mag.com/archive/02/Spring/fogelle2.html.

(Continued)

*Primary Examiner*—Nhan Le
(74) *Attorney, Agent, or Firm*—Allen, Dyer, Doppelt, Milbrath & Gilchrist, P.A.

(57) ABSTRACT

A test method is for determining total isotropic sensitivity (TIS) of a mobile wireless communications device using an RF source controllable to a plurality of source values having a relatively small uncertainty associated therewith. The mobile wireless communications device may includes an antenna and a RF receiver coupled to the antenna and outputting an RSSI value having a relatively large uncertainty associated therewith. The method may include measuring a sensitivity of the RF receiver, and measuring an antenna gain pattern for the antenna based upon controlling the RF source to respective source values causing the RE receiver to generate a same target RSSI value as the RF source and wireless communications device are angularly moved relative to one another to thereby reduce the relatively large uncertainty of the RSSI value. The TIS may be determined based upon the measured sensitivity of the RF receiver and the measured antenna gain pattern.

21 Claims, 21 Drawing Sheets

U.S. PATENT DOCUMENTS

| | | | |
|---|---|---|---|
| 7,369,858 B2 * | 5/2008 | Backes et al. | 455/453 |
| 7,519,329 B2 * | 4/2009 | Qi et al. | 455/63.1 |
| 7,555,294 B2 * | 6/2009 | Qi et al. | 455/425 |
| 7,773,964 B2 * | 8/2010 | Ozaki et al. | 455/226.1 |
| 2001/0026150 A1 | 10/2001 | Klenner | 324/76.26 |
| 2005/0176375 A1 * | 8/2005 | Bednasz et al. | 455/67.12 |

FOREIGN PATENT DOCUMENTS

| | | |
|---|---|---|
| WO | WO2006047677 | 5/2006 |
| WO | WO2008031112 | 3/2008 |

OTHER PUBLICATIONS

Wiles, *CTIA test requirements cover over-the-air performance*, OTA Tests, wireless Europe, Oct./Nov. 2004.

CTIA Certification, *Method of Measurement for Radiated RF Power and Receiver Performance*, Test Plan for Mobile Station Over the Air Performance, Mar. 2005.

CTIA Certification Program, *Cellular Communications & Internet Association Method of Measurement for Radiated RF Power and Receiver Performance*, Test Plan for Mobile Station Over the Air Performance, Mar. 2003.

Universal Radio Communication Tester R&S CMU200, Rohde & Schwarz, 2004, available at www.rohde-schwarz.com.

Circadiant Tech Brief, *Sensitivity Measurement Algorithms*, Jan. 2003.

GSM RF Performance Evaluation (Antenna Testing) Pocket Guide, Cetecom, Apr. 16, 2004.

Raadt et al., *Cryptography in OpenBSD: An Overview*, In Proc. of the 1999 USENIX Annual Technical Conference, Freenix Track, pp. 93-101, Jun. 1999.

* cited by examiner

SYSTEM FOR DETERMINING TOTAL ISOTROPIC SENSITIVITY (TIS) USING TARGET RECEIVED SIGNAL STRENGTH INDICATOR (RSSI) VALUE AND RELATED METHODS

RELATED APPLICATIONS

This application is based upon prior filed provisional application Ser. No. 60/944,250 filed Jun. 15, 2007, the entire subject matter of which is incorporated herein by reference in its entirety.

FIELD OF THE INVENTION

The present invention relates to the field of communications systems, and, more particularly, to performance testing in mobile wireless communications systems, such as cellular communications systems, and related methods.

BACKGROUND OF THE INVENTION

Over the past decade, digital wireless (i.e., cellular) devices have become extremely popular with consumers. As a result, to maintain high customer satisfaction, wireless carriers, manufacturers and certification organizations have expressed interest in establishing higher standards with cellular device verification and certification processes.

To meet the demands of a growing diverse consumer market, carriers offer a wide range of wireless devices, such as cellular phones, personal digital assistants (PDA) and smart phones, from various manufacturers. All of these given device types may operate on the same carrier network simultaneously.

Wireless carriers have been heavily investing in radio frequency auction and infrastructure deployment. To maintain customer satisfaction with respect to voice quality and coverage map without additional infrastructure investment, carriers are striving to obtain high quality mobile wireless devices tested with a unified Radio Frequency (RF) testing standard so that the performance of the wireless devices from different manufacturers can easily be compared and the carriers can verify if these devices meet their network specifications.

It is also desired to have a unified testing standard so that manufacturers can know if the devices they designed can pass the certification of standardization organizations and meet the verification requirements of carriers during the design stage. Standardized testing is critical to the design process because it affects the time to market of the products.

For carriers, manufacturers and certification organizations such as Global Certificates Forum (GCF) and PCS Type Certificates Review Board (PTCRB) schemes, it is desired to have a test method that is reliable, accurate and manageable within a certain time frame. The Cellular Telecommunications & Internet Association (CTIA) has a measurement standard for mobile station over the air performance test plan which is largely adopted by the cellular industry. Two key parameters to determine wireless mobile station transmit and receive capabilities are total radiated power (TRP) and total isotropic sensitivity (TIS). TRP is a combined number of the average transmit antenna gain and transmit power, which determines the uplink performance of the terminal. The TIS is a single figure of merit that quantifies the mobile station's capability of receiving a weak signal averaged over a sphere.

Within the standard, the TRP measurement process is relatively fast and accurate compared to the TIS method. Yet, downlink and uplink performance are of equal importance. Poor TIS can result in a low quality voice signal, and it can also alter coverage maps. The current TIS test methodology suffers from the problems of lost base station signals (i.e., termination of calls), relatively large measurement uncertainty and relatively long test times as compared to the TRP test methodology.

DETAILED DESCRIPTION OF THE PREFERRED EMBODIMENTS

Figure 1:
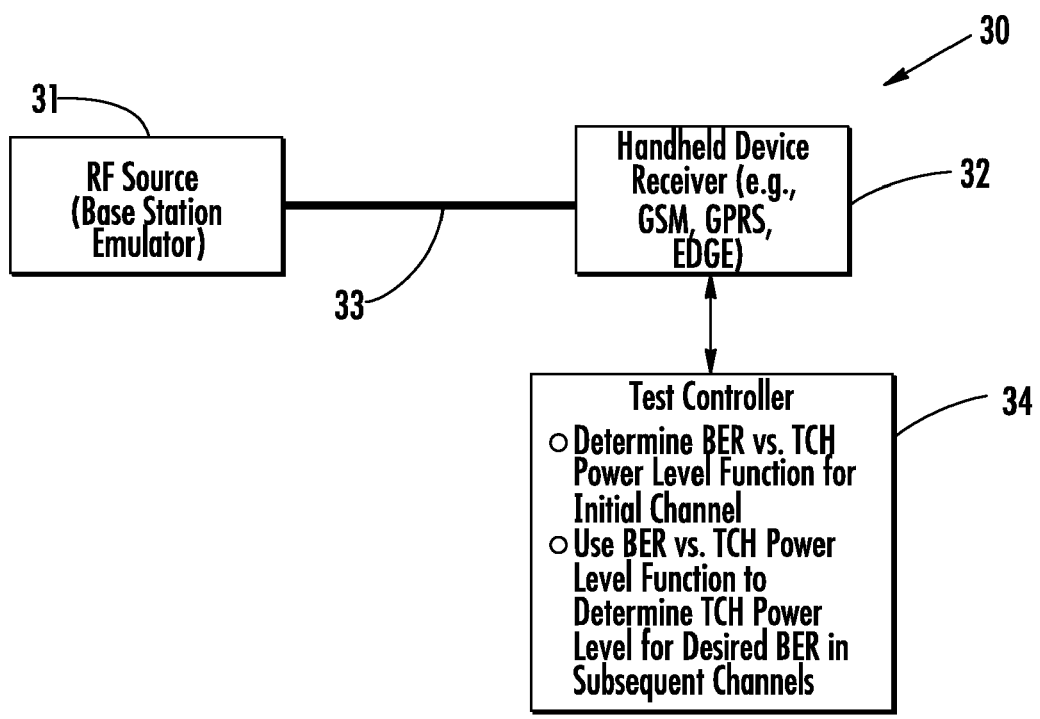
FIG. 1 is a schematic block diagram of an exemplary test system for measuring conducted radio frequency (RF) receiver sensitivity in accordance with an exemplary embodiment.

The present description is made with reference to the accompanying drawings, in which preferred embodiments are shown. However, many different embodiments may be used, and thus the description should not be construed as limited to the embodiments set forth herein. Rather, these embodiments are provided so that this disclosure will be thorough and complete. Like numbers refer to like elements throughout, and prime and multiple prime notation are used to indicate similar elements in alternative embodiments.

Generally speaking, the invention relates to a test method for determining total isotropic sensitivity (TIS) of a mobile wireless communications device using a radio frequency (RF) source controllable to a plurality of source values having a relatively small uncertainty associated therewith. Moreover, the mobile wireless communications device may include an antenna and a radio frequency (RF) receiver coupled to the antenna and outputting a received signal strength indicator (RSSI) value having a relatively large uncertainty associated therewith. The method may include measuring a sensitivity of the RF receiver, and measuring an antenna gain pattern for the antenna based upon controlling the RF source to respective source values causing the RF receiver to generate a same target RSSI value as the RF source and wireless communications device are angularly moved relative to one another to thereby reduce the relatively large uncertainty of the RSSI value. The method may further include determining the TIS of the mobile wireless communications device based upon the measured sensitivity of the RF receiver and the measured antenna gain pattern.

By way of example, the source values may be amplification and/or attenuation values. As such, measuring the antenna gain pattern for the antenna may include controlling the RF source based upon at least one course amplification/attenuation adjustment and at least one fine amplification/attenuation adjustment to determine an RSSI transition. In addition, measuring the sensitivity may include measuring the sensitivity of the RF receiver at a first power level, and measuring the gain pattern may include measuring the gain pattern of the antenna at a second power level higher than the first power level. The method may also include calibrating the RF source.

Determining the receiver sensitivity may include scanning transmit power levels of the RF source for a received signal strength indicator (RSSI) associated with a target bit error rate (BER). The method may further include measuring a free space path loss between the RF source and a reference antenna and calibrating the RF receiver based thereon. Also, the reference antenna may be a dipole antenna, for example. The measuring steps may be performed in an anechoic RF chamber.

A test system for determining TIS of a mobile wireless communications device, such as the one described briefly above, may include an RF source controllable to a plurality of source values having a relatively small uncertainty associated therewith, a wireless communications link coupling the RF source to the mobile wireless communications device, and a test controller. More particularly, the test controller may cooperate with the RF source and the RF receiver for measuring a sensitivity of the RF receiver, and measuring an antenna gain pattern for the antenna based upon controlling the RF source to respective source values causing the RF receiver to generate a same target RSSI value as the RF source and wireless communications device are angularly moved relative to one another to thereby reduce the relatively large uncertainty of the RSSI value. The test controller may also be for determining the TIS of the mobile wireless communications device based upon the measured sensitivity of the RF receiver and the measured antenna gain pattern.

The following description is organized as follows. First, a background discussion of TIS measurements and problems encountered therewith is provided, followed by a general overview of the new TIS measurement approach set forth herein. A discussion of new techniques for determining conducted and radiated sensitivity, path loss, and performing system calibration follows, certain aspects of which are also used in the new TIS measurement approaches. Thereafter, further discussion of the new TIS measurement approaches is provided.

The CTIA TIS standard measures radiated sensitivity at different angles with fixed attenuations set within the base station emulator. The attenuation is the free space path loss between the dual polarized source antenna, which connects to a base station's emulator, and a standard dipole antenna. The device under test (DUT) is measured at varied angles and a 3D characterization of the mobile receiver performance is constructed by compiling the spatial measurements. The TIS is a single value summarizing the overall three-dimensional performance of the DUT.

The approach provided herein for completing TIS tests advantageously addresses several fundamental issues of TIS measurements, which include search time, accuracy and dropped calls. Search time is determined by the time required to obtain large Bit Error Rate (BER) samples at every measured angle. Obtaining accurate TIS measurements is very impractical within a reasonable searching time because it is very time consuming to obtain large BER samples at refined steps of transmitter power reduction during the sensitivity search process, as will be appreciated by those skilled in the art. Dropped calls occur because of the antenna gain spread. That is, if at a given measurement angle the antenna gain is too low, the BER becomes extremely high and the base station cannot maintain a link. Similarly, at a given measurement angle, if the antenna gain is too high, the base station emulator could be overloaded and terminate the call. To obtain a reasonable searching time, the CTIA opted to use a smaller sample size and small angle density as compared to TRP measurements.

Generally speaking, the approach set forth herein measures radio radiated sensitivity and antenna gain separately. This methodology is more stable and faster than the current methodology, and it provides improved accuracy. TIS is a single value derived from both the spatially-diverse measurements of mobile antenna gain and overall sensitivity. The sensitivity measurement is the mobile station transmit (TX) power at which the mobile reports a Class II Residual Bit Error Rate (RBER) of 2.44 percent or less. Often the calibrated base station transmit power is decreased until the desired RBER is achieved. The CTIA standard TIS methodology measures both sensitivity and antenna gain in a multi-measurement 3D pattern. Terminated calls frequently occur during multiple sensitivity measurements, or while changing mobile device position at low emulator TX power.

The TIS method disclosed herein requires only one sensitivity measurement, and it can be done by measuring the antenna gain and the radio radiated sensitivity separately. Radio radiated sensitivity can be performed at any given angle. Receive antenna gain information can be obtained through path loss measurements reported by the Radio Signal Strength Indicator (RSSI).

To get accurate absolute antenna gain measurements, certain problems have to be addressed. One problem is that, within the GSM standard, there exists a reporting error of ±2 dB on the RSSI. This creates an inherent and unacceptable error. To remove such an error, the device may be calibrated in conducted or radiated mode, using a base station emulator. Furthermore, the base station emulator's transmit levels may be calibrated to ensure the satisfactory RSSI reporting. Primarily, the base station's transmit level is calibrated using relatively accurate equipment.

For the conducted calibration method, with the base station transmit level assured, the cable losses of the conducted cable and associated probes are determined. Further, the transmit level and associated cable losses are calculated, and the RSSI reporting of the mobile device is determined over the required ranges. Any deviation from the expected transmit level (subtracting the path loss of the cable) is the RSSI reporting error, and is recorded for future offset.

Also of note, base station emulators currently record GSM RSSI data as an integer in dB, not as a decimal number of dB. By truncating the numerical RSSI reporting system, there exists a base station forced error of +/−1 dB. However, while the base stations report with integer values, they show definitive fringe areas in which the integer changes to the consecutive integer. By finding this particular value, given 0.1 dB changes within the transmit level, the RSSI reporting accuracy of the base station emulator can be changed from +/−1.0 dB to 0.1 dB.

The path loss search compared to the BER sensitivity search is significantly more time efficient and yet equally or more accurate as compared to the current CTIA methodology. This path loss correction can also be used for accurate radio radiated sensitivity measurements. These measurements can be obtained by measuring a large BER sample with the correct path loss. Since the path loss search method only measures the sensitivity of one angle, highly accurate radio radiated sensitivity measurement can be obtained.

Within the base station emulator, the free space path loss is either physically or mathematically accounted for during the mobile station link. Although RSSI can be corrected using conducted mode inversely, if the antenna gain looks poorer due to the RSSI reporting lower due to reduce transmit level the sensitivity will look better. Target sensitivity is typically chosen to be within the upper limit at which the mobile device can still decode received signals. By way of example, a target BER of 2.44% is commonly used for many test implementations. The likelihood of mobile disconnects is much higher at a power level producing a BER at or above the target BER than at a transmit level which produces a relatively low BER. Subsequently, a mobile transmit level is chosen which will safely create such conditions over the entire spherical TIS measurement. This transmit level is preferably chosen to account for reasonable nulls within the antenna.

However, a change in base emulator transmit level and also device RSSI reading may cause a disassociation between the first measurement and all successive measurements. Thus, base station and mobile RSSI are preferably calibrated over all used ranges to ensure proper measurement linearity. RSSI and sensitivity errors inversely cancel each other. The total TIS is the same regardless of RSSI reporting and the inverse error caused to sensitivity.

RSSI reporting inaccuracy is accounted for using a newly devised path loss searching method. Dropped calls are reduced by using a relatively high base station emulator transmit level, and associated RSSI curve uncertainty is removed by calibration. Moreover, a new elimination method is used to reduce system error.

Base station emulators record GSM RSSI as an integer rather than a rational number. By truncating the reported number, there exists a forced error of +/−1 dB. As with all truncated numbers, there exists a well-defined area of change between consecutive integers. This can be found by changing the base station emulator transmit level by the lowest resolution possible. The error is then reduced from ±1.0 dB to the stated resolution. Typically this resolution is 0.1 dB, so the resultant error is ±0.1 dB. All other, non-border values less than 1 dB and multiples of the lowest resolution can be achieved by first going to the border value and changing the transmit level to the desired level.

There are several different methods for determining the value of change between consecutive reported integer RSSI values. Picking a semi-random position and then increasing or decreasing by 0.1 dB intervals or steps is one mathematically simple search method to implement. However, other search methods may be used. It is desirable to use an approach which will, on average, provide increase efficiency. This involves minimizing the number of successive attempts (i.e., steps) to find the border value. One approach discussed further below is the 5-2-1-1 method, which moves in a "leap-frog," or binary-search, pattern. As the name suggests, the four movements are typically 0.5 dB, then 0.2 dB, then two successive 0.1 dB jumps. By examining the reported RSSI and making corrections to the direction (positive or negative) adjustment of the step, the border value can be determined. Also for consideration, RSSI reporting often has switching hysteresis which may need to be accounted for.

The RSSI, with ±2.0 dB error, has no effect on TIS due to the inverse nature of RSSI on device sensitivity and antenna gain. If RSSI reports in such a manner as to indicate that the free space path loss is smaller than actual by reporting transmit levels higher than the combined base station emulator transmit level, the antenna gain will appear proportionally larger by the difference amount. However, actual receiver transmit level at the mobile will be lower then expected, thus reaching the target sensitivity sooner. The sensitivity will thus look worse by the same amount that the antenna gain looks better.

By way of example, if transmit power is −70 dB, with a path loss of 40 dB, the expected RSSI is −110 dB. If the RSSI were to in error report −108, the expected antenna gain would be 2 dB up (to account for the difference in expected and reported). However, by basing the measurement on RSSI, the value at which the device is returning the bit error ratio is 2 dB down. In this example, although the device is assumed to be receiving a −108 dB signal, it is in fact receiving a −110 dB signal. It will reach the target bit error ratio reporting 2 dB higher. The sensitivity will look worse by the amount inverse to the antenna gain improvement, or vice versa. Thus, since TIS is a combination of antenna gain and sensitivity, it will have no effect.

TIS is a single figure of merit that quantifies the mobile station's capability of receiving a weak signal averaged over a sphere. The TIS determines the downlink performance of the terminal. TIS in dB equals the radio radiated sensitivity minus antenna gain, i.e., $$TIS = P_s - G_r, \qquad (1)$$

where $P_s$ is radio radiated sensitivity and $$G_r = \frac{1}{4\pi} \int_0^{2\pi} \int_0^{\pi} G(\theta, \phi) \sin\theta d\theta d\phi, \qquad (2)$$

where $G(\theta,\phi)$ is the receive antenna power pattern.

Referring now to FIG. 1, a test system 30 for measuring conducted receiver sensitivity is first described. The system 30 illustratively includes an RF test source 31 coupled to a handheld device receiver 32 to be tested via an RF cable 33. By way of example, the handheld device receiver 32 may be a Global System for Mobile Communications (GSM) receiver, a General Packet Radio Service (GPRS) receiver, and/or an Enhanced Data Rates for Global System for Mobile Communications (GSM) Evolution (EDGE) receiver, for example. Of course, other suitable wireless receivers may also be used.

In addition, the RF source 31 may be a Rohde and Schwartz universal radio communication tester or an Agilent 8960 base station emulator, for example, although other suitable emulators and/or RF test sources may also be used. A test controller 34 is connected to the handheld device receiver 32 for performing various test operations and measurements, which will be discussed in further detail below. It should be noted that while the RF source 31 and test controller 34 are illustrated as separate components in the FIG. 1, the functions of the RF source and test controller may in fact be performed by the same base station emulator, for example. Alternately, the test controller 34 could be a computer or computing device separate from the RF source 31, as will be appreciated by those skilled in the art.

Path loss plays an important role in the accuracy of a radio conducted sensitivity measurement as will be appreciated by those skilled in the art. One difficulty of performing a path loss measurement in a test configuration, however, is that typical base station emulators only report a receiver accuracy level of ±1 dB, as noted above, even though the internal amplifier of the receiver 32 may have much greater accuracy, for example, of about ±0.1 dB. By obtaining sign change information in the receiver power level, the path loss accuracy can therefore be improved to ±0.1 dB, as will be discussed further below.

In the case of a conducted receiver sensitivity test, the path loss of the cable 33 that connects the receiver 32 and the base station emulator 31 can be well calibrated. One relatively straightforward accurate path loss measurement involves changing the internal amplification of the receiver 32 by 0.1 dB increments until the desired RSSI edge point is obtained. However, if the starting point is 0.9 dB from the edge point, it will take many steps and, therefore, increased measurement time to find the edge point. Accordingly, more complex test schemes may be used to reduce the number of steps that will be required on average to find the edge point and, therefore, reduce test times.

Figure 11:
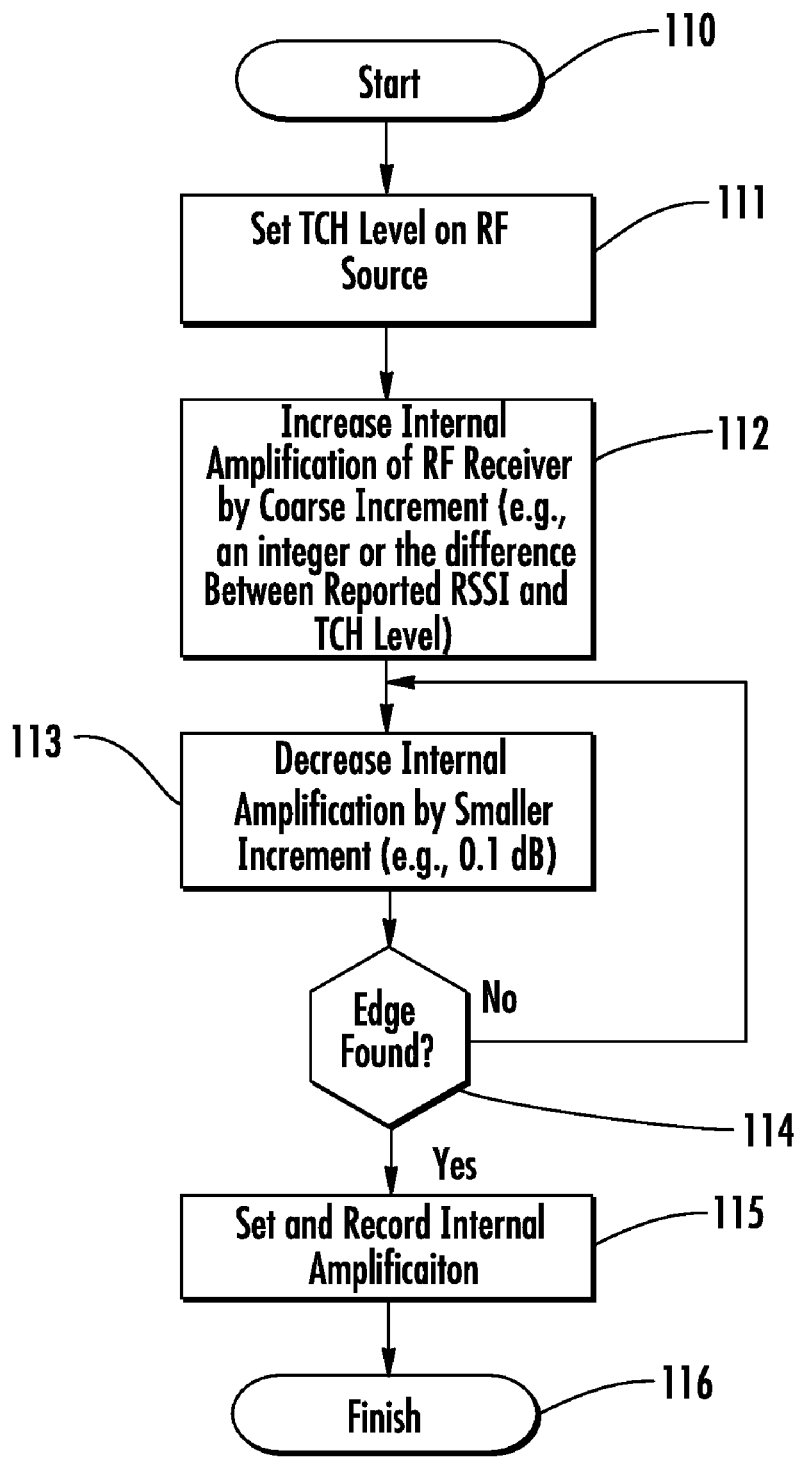
FIGS. 11-15 are flow diagrams of exemplary methods for determining path loss in accordance with an exemplary embodiment.

For example, one slightly more complex approach is illustrated in FIG. 11. Beginning at Block 110, the desired TCH power level is first set on the RF source 31, at Block 111. The internal amplification level of the receiver 32 is first changed by a coarse increment, such as the difference between the reported RSSI of the receiver and the TCH power level or other integer value, at Block 112. The edge is then found by changing the internal amplification level of the receiver using a fine increment (e.g., 0.1 dB) until the edge transition is observed to provide the path loss, at Blocks 113-114, at which point the internal amplification value of the receiver 32 may be set and/or recorded (Block 115), thus concluding the illustrated method (Block 116).

Stated alternatively, the "coarse" search changes the internal amplification by the difference between TCH level and reported RSSI. Since in the present example the reported RSSI is an integer value, this gives an accuracy of ±1 dB. The "fine" search then determines the edge between two consecutive RSSI readings.

Other variations of the coarse-fine edge point detection approach may also be used. Generally speaking, the coarse portions of these searches are fairly similar, so particular attention will be given herein to the variations in the fine search that may be used as appropriate for a given implementation. A fine search generally includes three stages. First, the RSSI is set to the desired level by adjusting the internal amplification and the TCH level of the base station emulator. Next, the internal amplification is changed in a series of successively decreasing increments to find the edge. These increments should narrow to 0.1 dB (or the accuracy of the given internal amplifier) to ensure the accuracy is also 0.1 dB. Finally, it may be necessary to "step back" to the edge point, as the measurements may have left off 0.1 dB from the desired RSSI.

Figure 12:
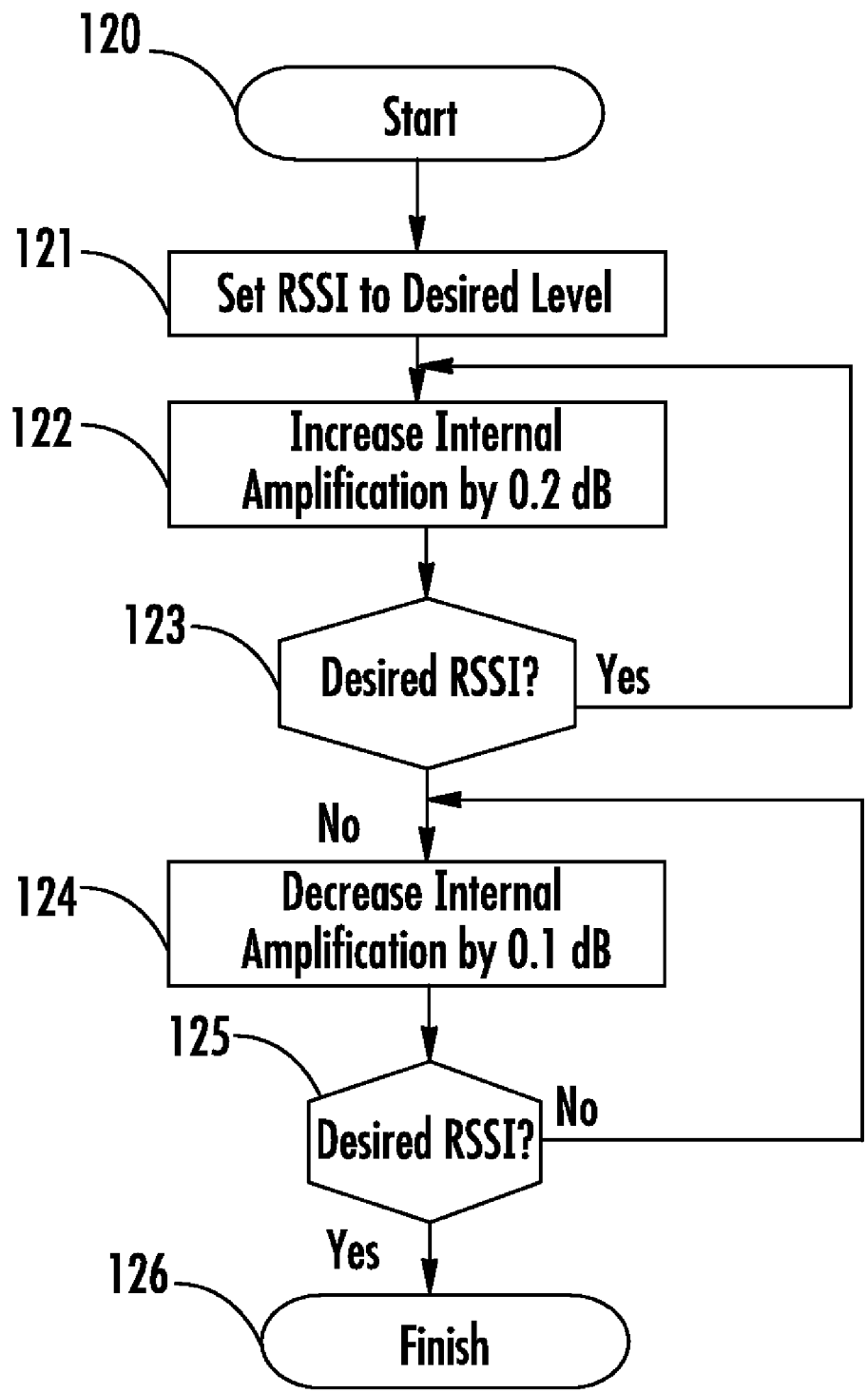

Another example of a fine search is now described with reference to FIG. 12. Beginning at Block 120, the RSSI is set to the desired level, at Block 121, and the internal amplification changed in 0.2 dB increments until the desired RSSI is no longer reported, at Blocks 122-123. That is, after a number of steps (typically between one and five), the returned RSSI will not match the desired level since the internal amplification will have jumped the edge by 0.1 or 0.2 dB. Thus, decreasing or "stepping back" the internal amplification level in 0.1 dB increments will find the edge point either in one or two steps, at Blocks 124-125 (depending upon whether the edge was jumped by 0.1 or 0.2 dB), thus concluding the illustrated method (Block 126).

Figure 13:
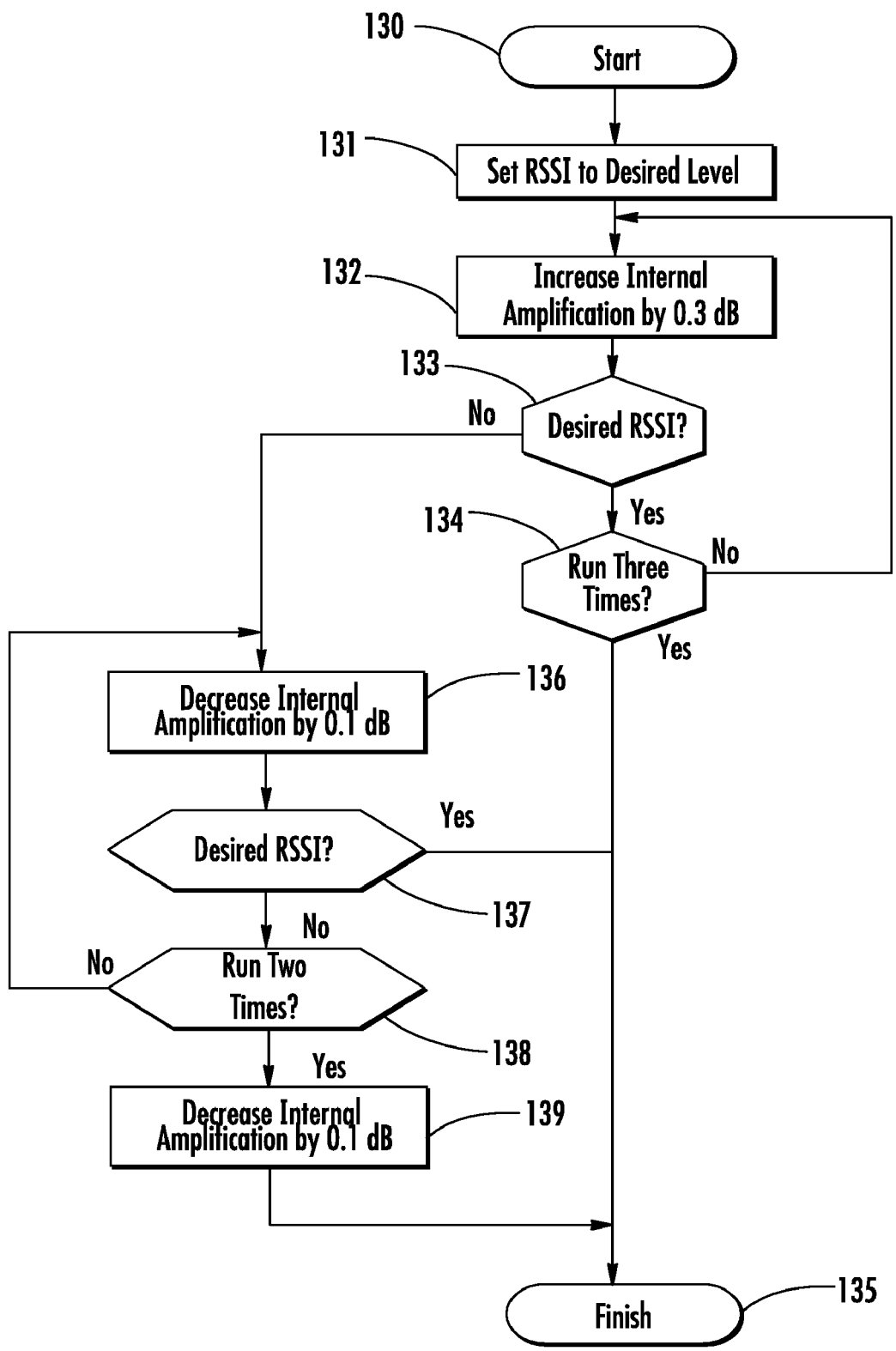

Another fine search process is now described with reference to FIG. 13. Beginning at Block 130, the RSSI is set to the desired level, as discussed above, and then the internal amplification is increased by 0.3 dB increments until the RSSI is no longer the desired value, at Blocks 131-133. Once the RSSI changes, two consecutive 0.1 dB scans will yield a change in RSSI, thus locating an edge, at Blocks 136-138, and the internal amplification is decreased by 0.1 dB (Block 139), thus concluding the illustrated method. For example, if the sum total change is 0.1 dB (e.g. +0.2 and then −0.1 dB, totaling +0.1 dB) and this produces a change in RSSI, an edge has been found. Alternatively, if the internal amplification is changed three times (i.e., 0.9 dB) without the RSSI changing from the desired value, at Block 134, an edge is also located, as a 1.0 dB change will change the RSSI since they are reported in integers.

Figure 14:
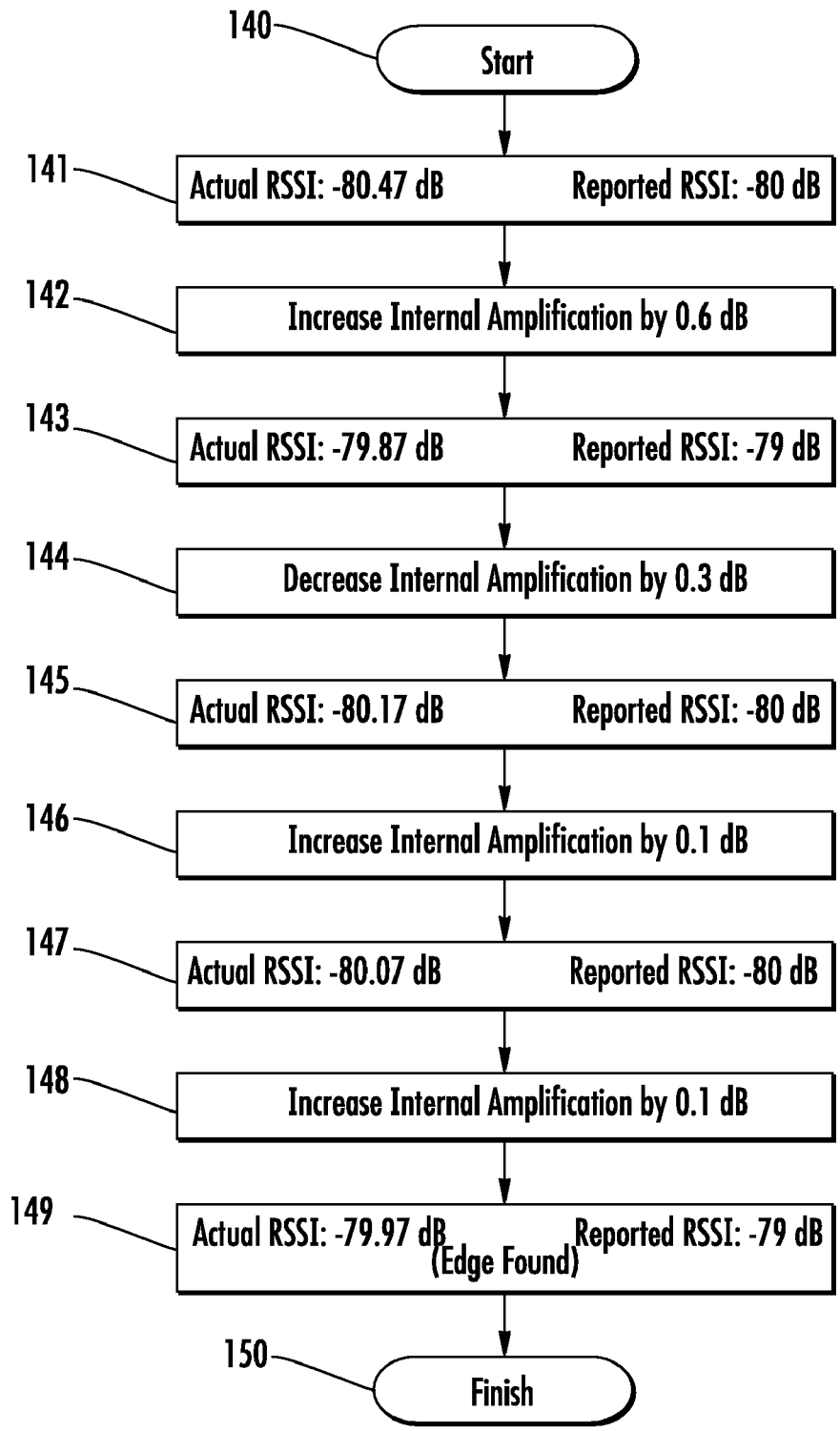

Another exemplary approach is now described with reference to FIG. 14. Beginning at Block 140, a starting actual RSSI value is −80.47 dB, and the reported RSSI is −80 db (Block 141). The internal amplification is then increased by 0.6 dB, at Block 142, changing the actual RSSI value to −79.87 dB, and the reported RSSI to −79 db (Block 143), indicating that the edge has been crossed. The next step is a 0.3 dB decrease, at Block 144, which changes the actual RSSI value to −80.17 dB, and the reported RSSI back to −80 db (Block 145), indicating the edge has been crossed back over. As such, the internal amplification is increased by 0.1 dB, at Block 146, changing the actual RSSI value to −80.07 dB, and the reported RSSI remains at −80 db (Block 147), meaning the edge was not crossed. Accordingly, another 0.1 dB increase is performed (Block 148), which changes the actual RSSI value to −79.97 dB, and also changes the reported RSSI to −79 dB, thus locating the edge (Block 149), and concluding the illustrated method, at Block 150.

It will be appreciated by those skilled in the art that many different edge location schemes may be used. The first, and each successive, jump is typically any number from 0.1 to 0.9 dB. Jump values can change or remain constant for each step. To choose an appropriate method for a given application, variation of the data and average performance are important considerations. For example, with relatively "flat" data the approach illustrated in FIG. 11 may locate the edge quicker than the approach illustrated in FIG. 12, but the opposite may be true for "sloped" data, potentially by up to three steps.

Figure 15:
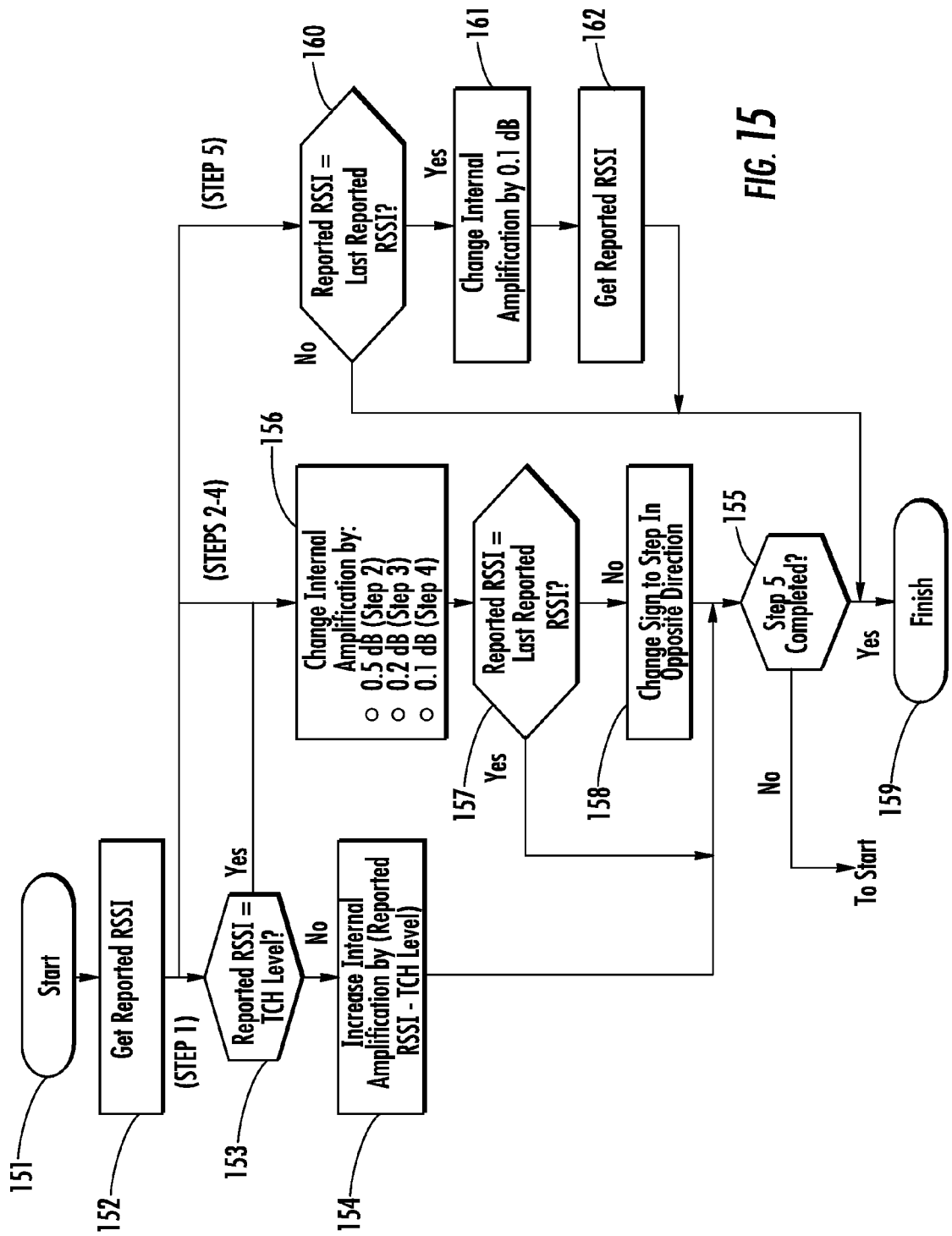

Still another approach now described with reference to FIG. 15 is a five-step path loss scheme. Beginning at Block 151, the reported RSSI for a given TCH level is obtained, at Block 152. The first step includes determining if the reported RSSI is the same as the TCH level, at Block 153. If so, the method proceeds to step two. If not, the internal amplification is increased (or decreased depending upon the particular implementation) by the difference of the reported RSSI minus the given TCH level, at Block 154. The new reported RSSI is then obtained (Block 152), and for steps two through four the internal amplification is changed in successively decreasing increments of 0.5 dB, 0.2 dB, and 0.1 dB, at Block 156.

If the reported RSSI is not the same as the last reported RSSI after each of these changes, then the sign is changed before the next step (Block 158) to step in the opposite direction (i.e., back toward the edge). Once the first four steps are completed, the fifth step involves once again determining if the reported RSSI is the same as the last reported RSSI, at Block 160, and if so changing the internal amplification by 0.1 dB once again (which will be the edge) and obtaining the reported RSSI, at Blocks 161, 162, to conclude the illustrated method (Block 159). This approach is advantageous in that it will converge on the edge point within five steps, which provides good overall results for different curve types.

Use of a path loss search in a test method for determining conducted radio frequency (RF) receiver sensitivity for a plurality of channels extending over one or more frequency bands will now be described with reference to FIGS. 3 and 4. As will be appreciated by those skilled in the art, receiver sensitivity is defined based upon a traffic channel (TCH) power level at a desired bit error rate (BER). BER is an "end-to-end" performance measurement which quantifies the reliability of the entire radio system from "bits in" to "bits out," including the electronics, antennas and signal path in between.

Aside from the relatively poor reporting accuracy of receiver test equipment, another difficulty in determining receiver sensitivity is that it can be a very time consuming process. That is, there are typically numerous channels within a cellular band, and a cellular device may operate over multiple bands, as noted above. Thus, a sensitivity measurement covering all of the channels used by a device may take many hours, and even days, to complete.

To reduce receiver sensitivity measurement times, a relatively fast sensitivity search algorithm is preferably used. Beginning at Block 40, if the path loss of the RF cable 33 is not already known, using one of the above-described path loss searches (or others) a path loss function may advantageously be determined, at Block 48'. More particularly, path loss associated with the RF cable 33 will be different for different channels (i.e., frequencies), but there will be a generally linear relation between these path loss values. Accordingly, by determining the path loss of two separate channels (e.g., the first and last channels in the band), a linear path loss function for the RF cable 33 can be quickly generated. This provides a quick and accurate approximation of path losses for all of the channels, although the path loss for each channel could be measured separately in some embodiments, if desired.

Furthermore, a BER versus TCH power level function is determined for an initial channel, at Block 41. The initial channel could be any channel in the band, but for explanation purposes it will be assumed to be the first channel in the band. It has been found that given enough sampling frames, the general shape of the TCH power level vs. BER function for a given channel in a frequency band will be essentially the same for all of the remaining channels in the band. This is due to fact that the function is determined by the modulation scheme and digital signal processing (DSP) algorithm of the handheld device. By way of example, GPRS has a GMSK modulation scheme. Since the relationship for BER vs. energy per bit has an exponential form, the BER vs. TCH level function also takes the form of an exponential. Thus, once the shape of this function is found for one channel, this function can be used to rapidly locate the TCH level/target BER point for each of the following channels, as will be discussed further below.

In particular, the BER versus normalized TCH power level function is determined for the initial channel by measuring respective TCH power levels for a plurality of BERs within a target BER range, and determining the BER versus TCH power level function based upon the measured BERs in the target BER range (i.e., curve fitting based upon the measured values), at Block 41'. Typically speaking, only BER values within a particular target range will be of interest because values outside of this range will result in dropped connections, etc. By way of example, the target range may be about one to three percent, although other target ranges may be appropriate for different applications. Various curve fitting approaches, such as a least squares approach, for generating the BER versus TCH power level function will be discussed further below.

To find the edges of the BER target range, a coarse search may be used that involves stepping the TCH power level in relatively coarse negative increments (e.g., −1.5 db) when the measured BER is less than 0.5, and relatively coarse positive increments (e.g., +2.0 dB) when the measured BER is greater than 3.0. This gives a relatively close approximation of the target range edge points, and successive measurements within the target range may then be made at relatively fine TCH power level increments (e.g., 0.1 dB increments) to provide the data points for curve fitting.

Curve fitting is appropriate because BER data is often accompanied by noise. Even though all control parameters (independent variables) remain constant, the resultant outcomes (dependent variables) vary. A process of quantitatively estimating the trend of the outcomes, also known as curve fitting, therefore becomes useful. The curve fitting process fits equations of approximating curves to the raw field data, as will be appreciated by those skilled in the art.

As noted above, the data for the BER vs. TCH level function is generally exponential. Two exemplary curve-fitting approaches that may be used to fit an exponential curve are a least square polynomial approximation and a non-linear (i.e., exponential) least square approximation. The theory and implementation of a least square polynomial approximation is first described. Since polynomials can be readily manipulated, fitting such functions to data that does not plot linearly is common. In the following example, n is the degree of polynomial and N is the number of data pairs. If N=n+1, the polynomial passes exactly through each point. Therefore, the relationship N>n+1 should always be satisfied.

Assuming the functional relationship $$y = a_0 + a_1 x + a_2 x^2 + \ldots + a_n x^n,$$

with errors defined by $$e_i = Y_i - y_i - Y_i - a_0 - a_1 x_i - a_2 x_i^2 - \ldots - a_n x_i^n,$$

where $Y_i$ represents the observed or experimental value corresponding to $x_i$, with $x_i$ free of error, the sum of squares of the errors will be $$S = \sum_{i=1}^{N} e_i^2 = \sum_{i=1}^{N} (Y_i - a_0 - a_i x - a_i x^2 - \ldots - a_n x_i^n)^2.$$

At a minimum, the partial derivatives $\delta S/\delta a_0$, $\delta S/\delta a_1$, ..., $\delta S/\delta a_n$ "vanish." are zero. Writing the equations for these terms gives n+1 equations as follows:

$$\frac{\delta S}{\delta a_1} = \sum_{i=1}^{N} 2(Y_i - a_0 - a_1 x_i - \ldots - a_i x_i^n)(-1)$$

$$\frac{\delta S}{\delta a_0} = \sum_{i=1}^{N} 2(Y_i - a_0 - a_1 x_i - \ldots - a_i x_i^n)(-x_i)$$

$$\vdots$$

$$\frac{\delta S}{\delta a_n} = \sum_{i=1}^{N} 2(Y_i - a_0 - a_1 x_i - \ldots - a_i x_i^n)(-x_i^n).$$

Dividing each equation by −2 and rearranging gives n+1 normal equations to be solved simultaneously:

$$a_0 N + a_1 \Sigma x_i + a_2 \Sigma x_i^2 + \ldots + a_n \Sigma x_i^n = \Sigma Y_i$$

$$a_0 \Sigma x_i + a_1 \Sigma x_i^2 + a_2 \Sigma x_i^3 + \ldots + a_n \Sigma x_i^{n+1} = \Sigma x_i Y_i$$

$$a_0 \Sigma x_i^2 + a_1 \Sigma x_i^3 + a_2 \Sigma x_i^4 + \ldots + a_n \Sigma x_i^{n+2} = \Sigma x_i^2 Y_i$$

$$a_0 \Sigma x_i^n + a_1 \Sigma x_i^{n+1} + a_2 \Sigma x_i^{n+2} + \ldots + a_n \Sigma x_i^{2n} = \Sigma x_i^n Y_i.$$

Putting these equations in matrix form reveals a notable pattern in the coefficient matrix:

$$\begin{bmatrix} N & \Sigma x_i & \Sigma x_i^2 & \Sigma x_i^3 & \cdots & \Sigma x_i^n \\ \Sigma x_i & \Sigma x_i^2 & \Sigma x_i^3 & \Sigma x_i^4 & \cdots & \Sigma x_i^{n+1} \\ \Sigma x_i^2 & \Sigma x_i^3 & \Sigma x_i^4 & \Sigma x_i^5 & \cdots & \Sigma x_i^{n+2} \\ \vdots & \vdots & \vdots & \vdots & \vdots & \vdots \\ \Sigma x_i^n & \Sigma x_i^{n+1} & \Sigma x_i^{n+2} & \Sigma x_i^{n+3} & \cdots & \Sigma x_i^{2n} \end{bmatrix} * \begin{bmatrix} a_0 \\ a_1 \\ a_2 \\ \vdots \\ a_n \end{bmatrix} = \begin{bmatrix} \Sigma Y_i \\ \Sigma x_i Y_i \\ \Sigma x_i^2 Y_i \\ \vdots \\ \Sigma x_i^n Y_i \end{bmatrix}$$

This matrix equation is called the normal matrix for the least-square problem. In this equation $a_0, a_1, a_2 \ldots a_n$ are unknown coefficients while $x_i$ and $Y_i$ are given. The unknown coefficients $a_0, a_1, a_2, \ldots a_n$ can hence be obtained by solving the above matrix equations.

To fit the curve $Y_i$, it is required to know what degree of polynomial should be used to best fit the data. As the degree of polynomial is increased, the deviations of the point from the curve is reduced until the degree of polynomial, n, equals N−1. At this point, there is an exact match. In terms of statistics, the degree of approximating the polynomial is increased as long as there is a statistically significant decrease in the variances, $\sigma^2$, which is computed by:

$$\sigma^2 = \sum \frac{e_i^2}{N - n - 1}.$$

The approach illustrated above was programmed in two exemplary implementations using C++ and the normal matrix was solved using two different methods, namely the Gauss-Jordan approach and LU decomposition, as will be appreciated by those skilled in the art. Although both of these methods produced comparable results, the LU decomposition method was found to be more desirable for the least square polynomial approximation program because LU decomposition provided desired performance results.

The above noted C++ program was implemented so that it is able to calculate the coefficient of the approximated curve fitting equation of varying degree. Polynomials with degrees of 2, 3, 4 and 5 were used to fit a curve against BER data values, and it was found that third degree polynomial produced the most advantageous results. More particularly, degrees higher than three did not show any significant improvement in the fitted curve. Therefore, a third degree polynomial was used to fit the curve against BER data values.

The theory and implementation of fitting non-linear exponential curves using a least squares approach will now be described. In many cases data obtained from experimental tests is not linear. As such, it is necessary to fit some other function than a first-degree polynomial to this data. Some common forms that may be used are exponential forms of a type $y = ax^b$ or $y = ae^{bx}$.

Normal equations for these forms can again be developed by setting the partial derivatives equal to zero, but such non-linear simultaneous equations are much more difficult to solve than linear equations. Because of this, these forms are usually linearized by taking logarithms before determining the parameters, for example, $\ln y = \ln a + b \ln x$, or $\ln y = \ln a + bx$. Then, a new variable is introduced, i.e., $z = \ln y$ as a linear function of $\ln x$ or $x$. In this case, instead of minimizing the sum of squares of the deviations of Y from the curve, deviations of $\ln Y$ are minimized. To find which form of curve best fits the BER data, MathCAD mathematical software was used. A BER curve was plotted using MathCAD and different forms of the curve were fitted against the BER data. It was found that an exponential curve defined by $y = ce^{ax}$ provided a desirable fit for the BER data, although other functions may provide desired results in different implementations.

Data linearization is used to fit a curve of type $y = ce^{ax}$ to the data points given as $(x_1, y_1), (x_2, y_2), \ldots (x_N, y_N)$, where x is the independent variable, y is the dependent variable, and N is the number of x,y pairs. To linearize the data, a logarithm of both sides is taken, i.e., $\ln y = \ln c + ax$. Then a change of variable is introduced, namely $X = x$ and $Y = \ln(y)$, which produces the equation $Y = aX + \ln(c)$. This equation is a linear equation in the variables X and Y, and it can be approximated with a "least square line" of the form $Y = AX + B$. However, in this case, $\ln(y)$ will be used for performing least square approximation instead of y. Comparing the last two equations, it is noticed that $A = a$ and $B = \ln(c)$. Thus, $a = A$ and $c = e^b$ are used to construct the coefficients which are then used to fit the curve $y = ce^{ax}$.

Figure 16:
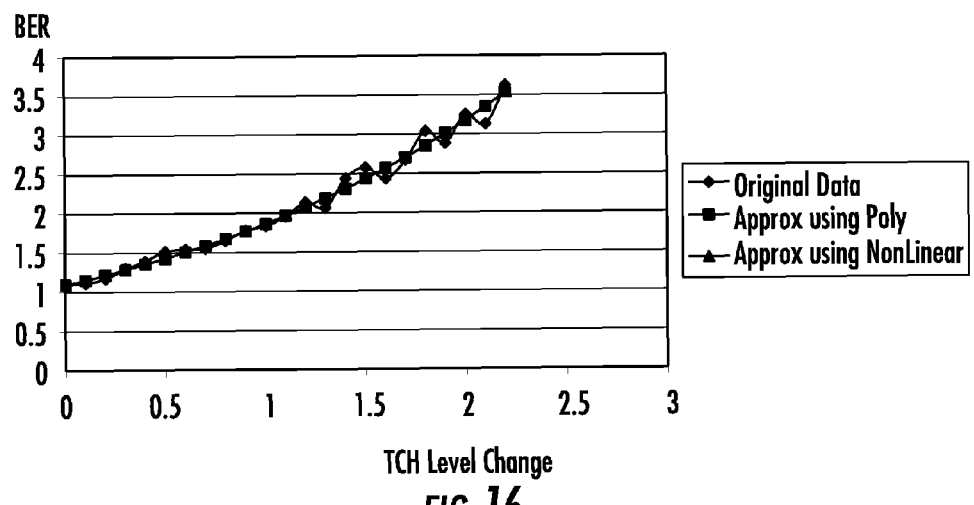
FIGS. 16 and 17 are graphs of BER versus TCH power level change for different sets of data, as well as corresponding BER versus TCH power level functions therefore, in accordance with an exemplary embodiment.
Figure 17:
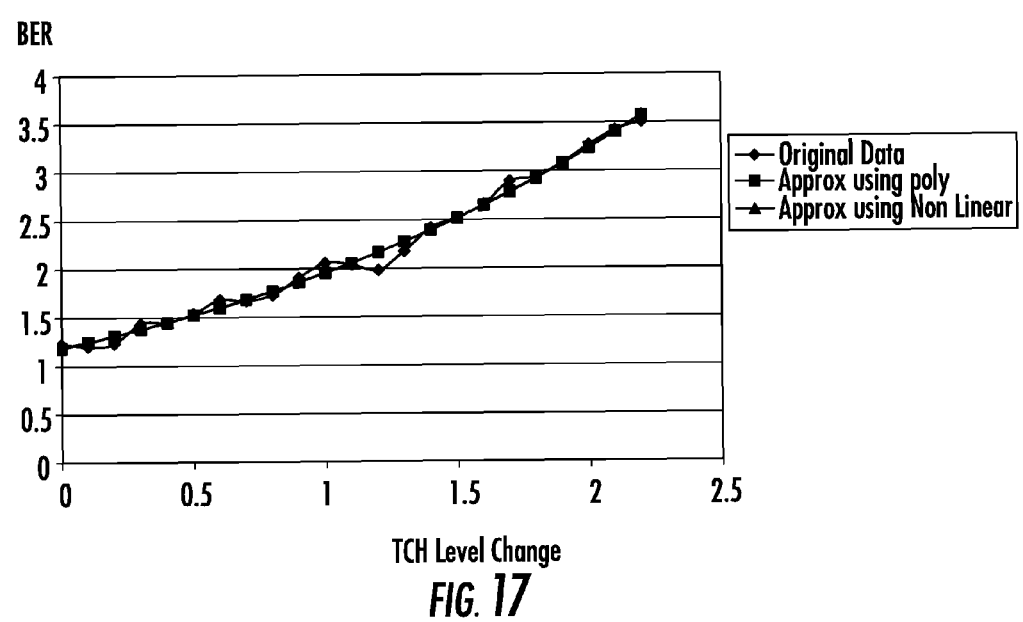

This approach was again programmed in C++. The normal matrix to be solved for this method was only 2×2, which was solved with a relatively high degree of accuracy. Plotted curves for two different sets of data using this approach are illustrated in FIGS. 16 and 17.

Both of the nonlinear exponential least square and least square polynomial approaches described above approximated the original data with a relatively high degree of accuracy. Generally speaking, the margin of error of the curves generated using these approaches will result in less than a 0.1 dB margin of error in the sensitivity measurement. In addition, the results provided by these methods are also very close to one another. Below are the results obtained by performing exponential and least square polynomial approximation on the two sets of data, namely data set 1 and data set 2. Here 'S' represents the standard error and 'R' represents the Correlation Coefficient.

Results for data set 1:
  3rd degree Polynomial Fit: $y = a + bx + cx^2 + dx^3 \ldots$

| Coefficient Data: | |
|---|---|
| a = 1.075334 | S = 1.720 |
| b = 0.653063 | R = .99168 |
| c = 0.097339 | |
| d = 0.048979 | |

Exponential Fit: $y=ae^{bx}$
Coefficient Data:
a=1.092514 Standard Error(S)=1.690
b=0.533035 correlation coefficient (R)=0.99158

Results for data set 2:
 3rd degree Polynomial Fit: $y=a+bx+cx^2+dx^3$ . . .

| Coefficient Data: | |
|---|---|
| a = 1.192487 | S = 1.101 |
| b = 0.565984 | R = .99592 |
| c = 0.164962 | |
| d = 0.031628 | |

Exponential Fit: $y=ae^{bx}$

| Coefficient Data: | |
|---|---|
| a = 1.1846416 | S = 1.131 |
| b = 0.5021062 | R = .99588 |

For both sets of results, the polynomial fit had a slightly higher correlation coefficient than the exponential fit. However, the standard error for the polynomial fit in data set 2 was smaller than for the exponential fit, but in data set 1 the standard error for the exponential fit was smaller than the polynomial fit.

Based on these results, the exponential fit model was deemed to be more preferable because it did not require inclusion of as many terms as the cubic function. This is because the exponential model $y=ae^{bx}$ provides almost the same accuracy (i.e., up to about the third decimal place) as that of the polynomial method, and it also has a physical interpretation of all the terms in it. Of course, the polynomial method or other approaches may be used in various applications as appropriate, as will be appreciated by those skilled in the art.

Generally speaking, if the data to be used in curve fitting does not appear to be approximated by a straight line, then there are often equations which can be used to fit the data very well. The first thing that comes to mind when considering the type of curve to fit to the data is a polynomial. This is because polynomials can be applied without much forethought and they are typically successful in matching the shape of the graphed data. However, when a higher degree polynomial is chosen to fit the data, it may be difficult to determine a theoretical basis for the coefficients in the polynomial equation. It is preferable to have such a basis for why a particular model is chosen, and that model should have some type of physical interpretation of each of the parameters in it.

Advantages of using linearizable equations to fit data are notable. Typically, curves of this type are somewhat easier to understand or predict than polynomials. That is, proper choice of the curve to fit the data can lead to insight concerning underlying mechanisms which produce the data. Secondly, manipulations of these curves such as differentiation, integration, interpolation and extrapolation can be made more confidently than can those with polynomials. Third, linearizable curves often require fewer numbers of parameters for estimation of values than do polynomials. As a result, the normal matrix may be small and can be solved with a relatively high degree of accuracy. Thus, this reduces the need to solve large sets of linear equations which often have an undesirable property of ill-conditioning. Thus, for BER data, Applicants have determined that it is generally desirable to use nonlinear forms such as logarithms, inversions, and exponentials to find the linearizable curve to match the shape of the data before resorting to a higher degree polynomial.

Having generated the BER vs. TCH power level function for the initial channel based upon measured BER values within the target range, this function may then be used to advantageously perform a fast search for the desired BER and corresponding TCH power level value in each of the subsequent channels in a given frequency band. First, an estimated or starting TCH power level for the subsequent channel is chosen based upon the BER vs. TCH power level function and the desired BER, at Block 42. That is, an estimate of the TCH power level that will correspond to the desired BER in the subsequent channel is determined and used as a starting point to hone in on the actual TCH power level for the desired BER. For purposes of the present discussion, a desired BER of 2.44% will be assumed, although other desired BERs may be appropriate based upon the given standard or carrier requirement that is to be met, as will be appreciated by those skilled in the art.

It should be noted that the estimated TCH power level may be chosen based upon the path loss function noted above. That is, one approach to determining the estimated TCH power level for the subsequent channel is to use the TCH power level for the initial channel that corresponds to the desired BER (i.e., 2.44%) and offset this value by the difference between the initial and subsequent channel path loss values on the path loss function (or actual measured values if a path loss function is not used), as will be appreciated by those skilled in the art (Block 42').

Once the estimated TCH power level is determined, then the BER of the subsequent channel is measured based thereon, at Block 43. If the measured BER is not within the target BER range (e.g., 1.0 to 3.0%), then the above-described coarse step search may be used to determine a TCH power level that is within the range. If the measured BER is within the target range, it is compared with the desired BER value, and the difference (i.e., delta) therebetween is used along with the BER vs. TCH power level function to determine a next estimated TCH power level, at Block 44. From the above discussion of the TCH power level function, it will be appreciated by those skilled in the art that the next estimated TCH power level may be estimated according to the relationship $\Delta BER=bce^{bx}\Delta TCHlevel$, since the $\Delta BER$ and the coefficient b are known.

Figure 3:
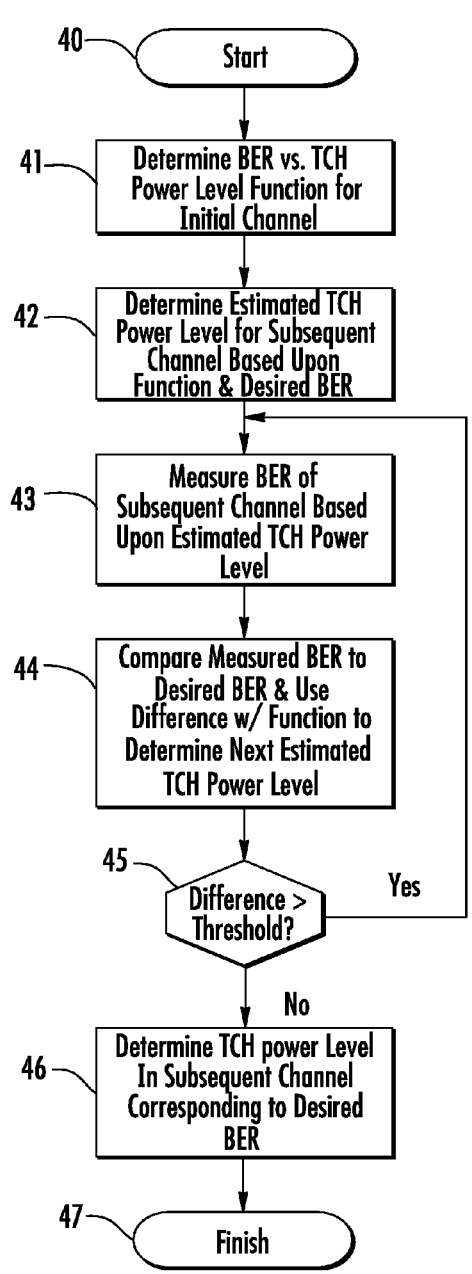
FIGS. 3-5 are flow diagrams of exemplary methods for RF receiver sensitivity measurement in accordance with an exemplary embodiment.
Figure 4:
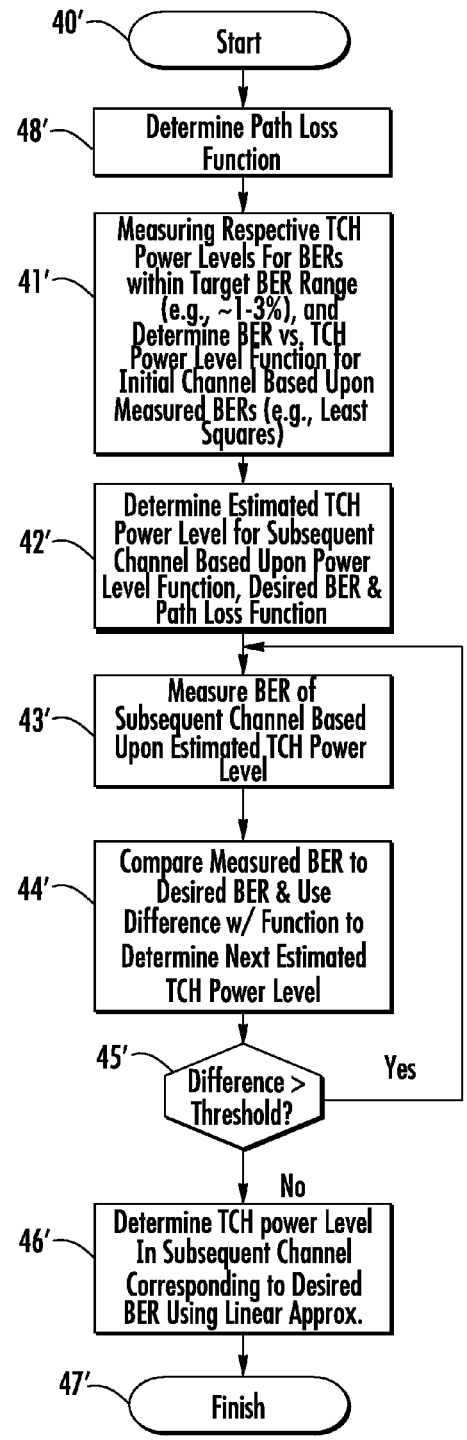

If the measured BER is not within a threshold range of the desired BER (e.g., ±0.15%), at Block 45, the steps described above with reference to Blocks 43 and 44 are repeated until a TCH power level corresponding to the desired BER (i.e., within the threshold range) is found, at Block 46, thus concluding the method illustrated in FIG. 3. Yet, if still further accuracy is desired, a linear approximation may be used, at Block 46'. More particularly, within a relatively small 0.3% BER range (i.e., the ±0.15% BER threshold range), the shape of the BER vs. TCH power level curve will be approximately linear. Therefore, this linear relationship may be used to provide still further accuracy, as will be appreciated by those skilled in the art.

Figure 2:
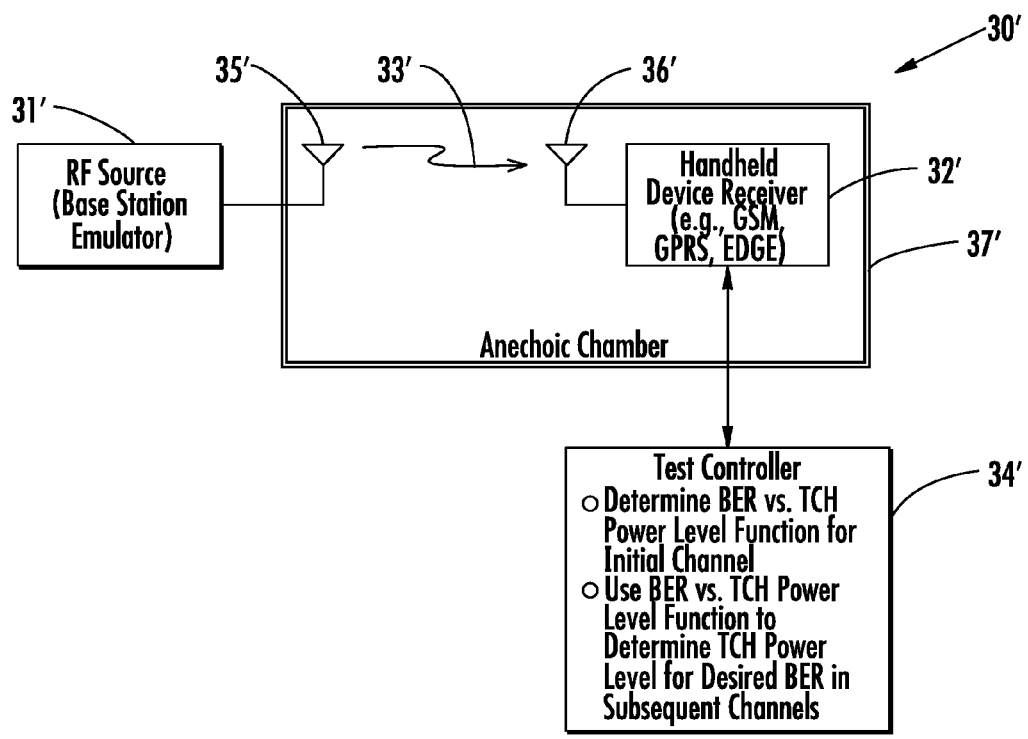
FIG. 2 is a schematic block diagram of an exemplary test system for measuring radiated RF receiver sensitivity in accordance with an exemplary embodiment.
Figure 5:
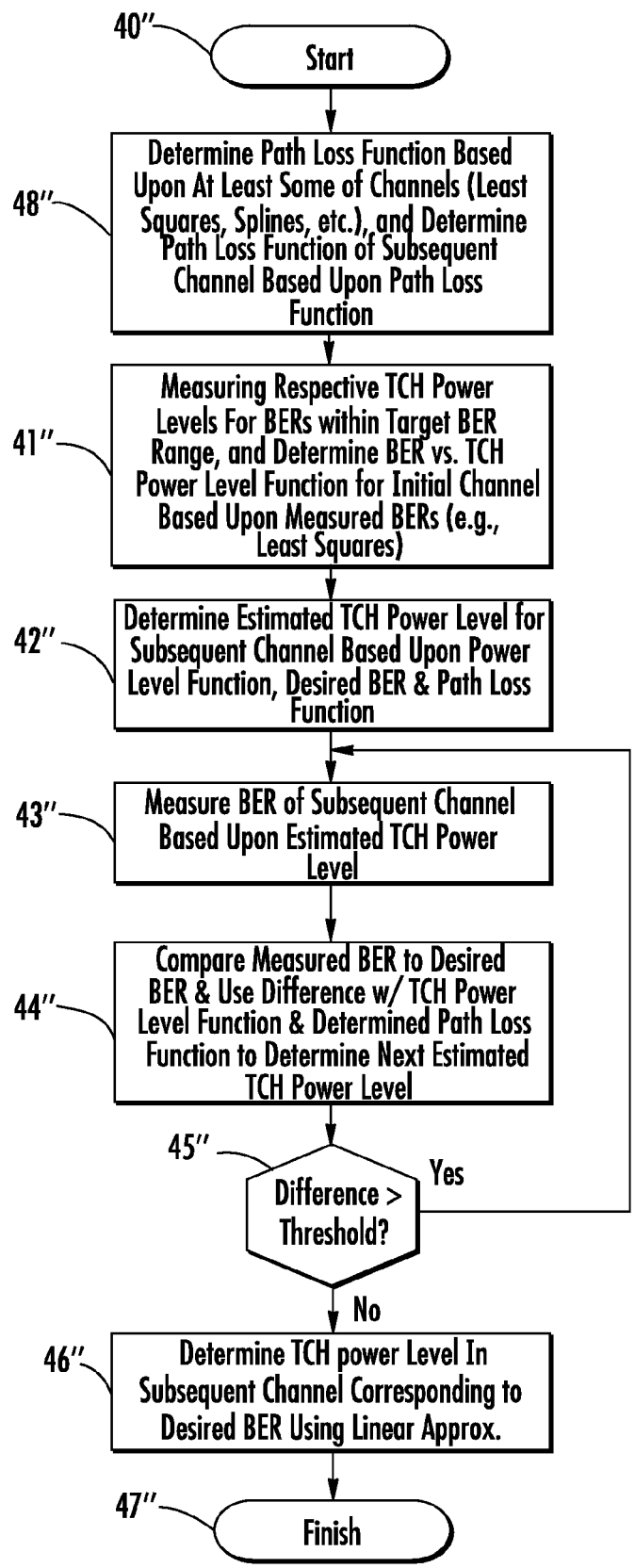

Turning now to FIGS. 2 and 5, a test system 30' and method for determining RF receiver radiated sensitivity are now described. The test system 30' includes the RF source 31' (e.g., a base station emulator), an RF controlled enclosed environment, and the wireless handheld device receiver 32'. As will be appreciated by those skilled in the art, an RF controlled enclosed environment is an electromagnetic (EM) wave shield environment, such as the illustrated EM anechoic chamber 37' (which may be a full or semi-anechoic chamber), a shield room or an RF enclosure An antenna 35' connected to the RF source 31' is positioned within the anechoic chamber 37' and connected to the RF source 31' by a coaxial cable to simulate a base station. An antenna 36' for the wireless handheld device is also positioned within the anechoic chamber 37' and connected to the handheld receiver 32'. It should be noted that in typical tests the handheld receiver 32' and antenna 36' will be carried by a device housing, but these components may be tested without the device housing if desired.

Generally speaking, the radiated receiver sensitivity search is the same as that described above for a conducted receiver sensitivity search with the exception of the path loss determination process. More specifically, the relationship between path loss values for a plurality of wireless channels in a frequency band will typically not be a linear function, as is the case for the RF cable 33. This is because path loss can be affected by factors such as antenna gain, antenna directivity and the measurement environment. Typically the path loss will be different for different wireless channels.

Even so, a path loss function may still be determined for the frequency band using similar approaches to those described above for determining the BER vs. TCH power level function (e.g., a least squares approximation, etc.), at Block 48". By way of example, the five-step path loss search described above with reference to FIG. 15 may be performed on a subset of the channels within the band, such as every 10th channel. This approach advantageously allows an accurate path loss function to be determined for the entire band to provide path loss estimates for every channel, yet without taking the time to individually measure the path loss of each channel. The path loss function is then used in determining the estimated TCH power level for the subsequent channel, at Block 42", as described further above.

Figure 6:
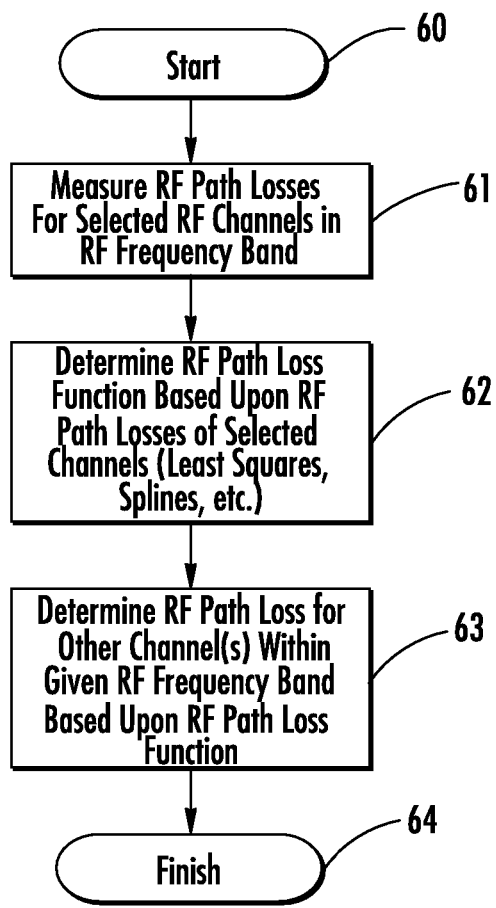
FIG. 6 is a flow diagram of an exemplary method for determining RF path loss in accordance with an exemplary embodiment.

The path loss determination process will now be described in further detail with reference to FIG. 6. Beginning at Block 60, RF path losses are measured for at least some of the RF channels within the RF frequency band, at Block 61. Using the above-noted example, path loss is measured every M channels. By way of example, M may be 10, although other intervals may also be used. An RF path loss function is determined based upon the measured RF path losses of the at least some RF channels, at Block 62, and an RF path loss for at least one other channel within the given RF frequency band is determined based upon the RF path loss function, at Block 63, thus concluding the illustrated method (Block 64).

The choice of M generally depends on the linearity of the system. That is, a linear system would only require two points to be measured, regardless of the number of the channels or frequency bandwidth. As the non-linearity or order of the system increases, the order of a single curve fitting equation should correspondingly increase to obtain a proper fitting. A least squares method, or other non-linear fitting methods, may be used. Many methods use matrices inversion where size is relative to the order of the equation. An inversion is increasingly complex and error prone as its dimensions increase. The least squares method requires a matrices inversion. Due to the nature of radio systems over large frequency spans, higher order path loss responses can exist.

Path loss curve fitting may also be performed using a plurality of splines. That is, many partial equations replace one complete equation. Sets of consecutive points (e.g., four consecutive points) are grouped on a rotating basis. For example, the first four points are used for generating the first spline series, the 2nd to 5th points for the second spline series, and so on. All but the first and last spline series use only intermediate points (e.g., the equation from points 2 to 3) as valid fitting equations. Using intermediate points for the equations leaves the first and last two points without respective equations. Different spline methods vary first and last spline construction. One method, an extrapolated cubic spline, uses the first two splines of the first series (e.g., points 1 to 2), the last two splines of the last series (e.g. points 3 to 4). Other suitable spline fit methods may also be used, as will be appreciated by those skilled in the art.

Figure 18:
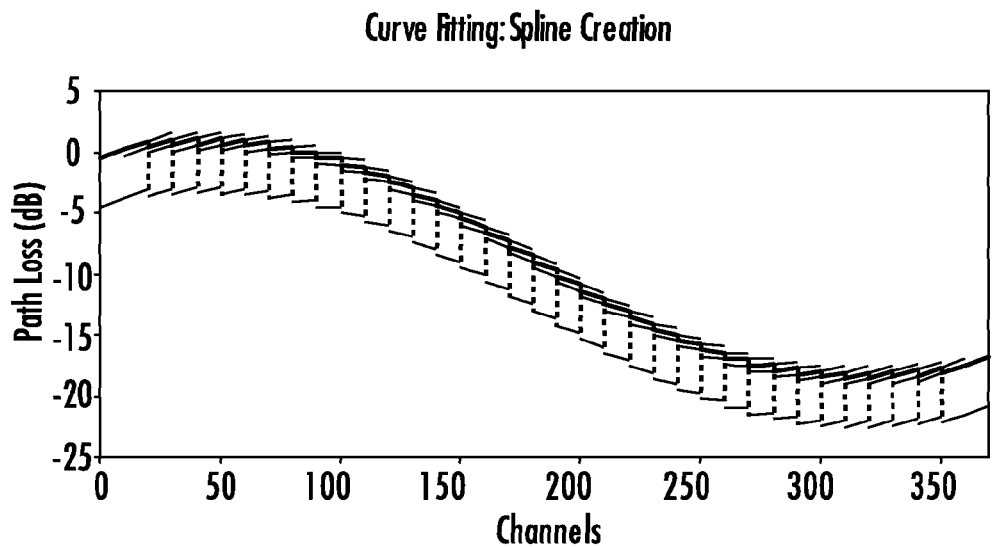
FIG. 18 is a graph illustrating sine waves approximated using spline fitting.

Referring to FIG. 18, two sine wave curves produced from respective series of splines are shown. Each curve is a spline fitting of a sine wave. Each line is one spline series within the spline fitting. The series are offset by −0.5 dB per spline series to show the overlapping spline series. Without the offset, the consecutive spline series would overlap. Data was taken from every 10th point. The upper figure is constructed of four point splines. The lower figure shows the upper spline with only the used data transposed, as mentioned above. The respective sine curves are offset by 4 dB for clarity purposes. Bold and dotted lines show the intermediate line transposition of the upper figure to the lower.

As noted above, path loss curve fitting reduces the measurement time of non-measured channels. Time is improved in systems with consecutive channel path loss difference exceeding the interpolation error. Linear interpolation will advantageously result in typical accuracy of under ±0.1 dB. The path loss method described above with reference to FIG. 6 may be used for radiated and conducted path loss measurements, as will be appreciated by those skilled in the art.

Another factor that may need to be accounted for in certain path loss/receiver sensitivity test measurements is the hysteresis of the particular handheld device under test. More particularly, receiver path loss is measured by comparing base station emulator TCH level output against the signal received by the handheld device and relayed to the emulator as RSSI. Consecutive 0.1 dB adjustments of the emulator's amplification will detect a region at which the change in amplification yields a change in RSSI. At this "edge" point the radio could oscillate between two RSSI readings with no amplification change. This edge point may be caused by system error, changing position or changing signal intensity, for example. As the RSSI readings oscillate, the handheld device could respond by changing its transmitter power in a similar oscillatory pattern, affecting the handheld power management. As such, many handheld devices manufacturers implement software within each mobile handheld device to change the edge to account for this problem.

Figure 19:
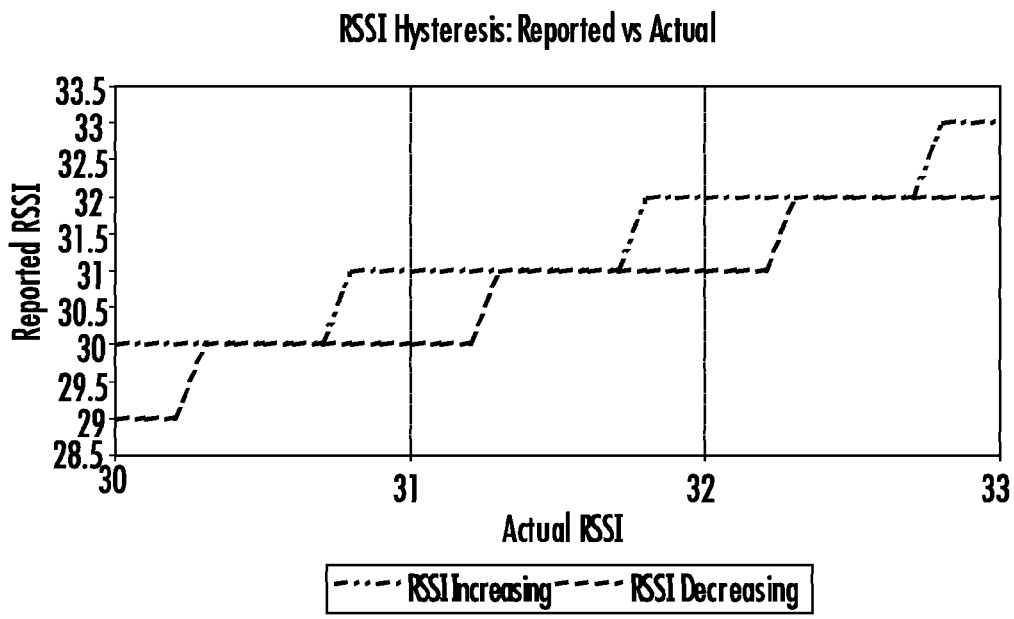
FIG. 19 is a graph of handheld device hysteresis switching.

More particularly, the problematic single RSSI edge point is divided into two different values. These two points straddle the actual edge point by an amount typically less than 0.5 dB, which is set within the handheld. As the received TCH level changes, the RSSI edge point will be reported prematurely, as shown in FIG. 19. This dual-edge system, known as hysteresis, decreases the likelihood of any oscillations within the RSSI and TX power control. As the device RSSI decreases, the reported RSSI to the base station emulator will change in such a way as to remove any oscillations if the device RSSI increases by only a small amount.

While the hysteresis prevents oscillations, it also creates an offset from the true RSSI edge. For a known device with known hysteresis, the value can be applied as an offset to each channel. For an unknown device, the hysteresis may need to be determined using a stepping algorithm, and then factored in to each path loss channel. The hysteresis is removed to obtain the true edge point. The hysteresis typically applies to all channels the same within a given band.

Figure 7:
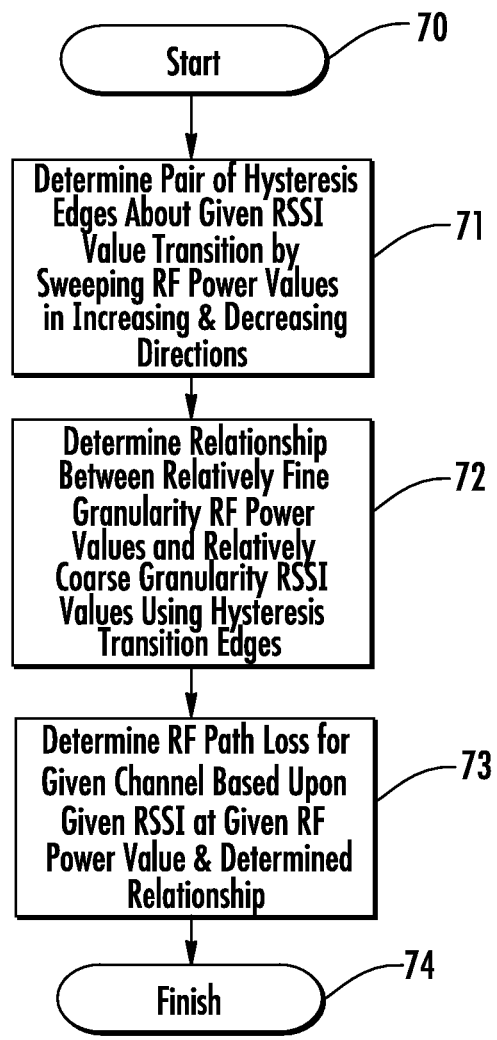
FIGS. 7 and 8 are flow diagrams of exemplary methods for determining RF path loss between an RF source and an RF receiver with hysteresis.

One exemplary method for determining path loss including a hysteresis search is now described with reference to FIG. 7. It should be noted that this approach may be used either for conducted path loss or radiated path loss, as will be appreciated by those skilled in the art. Beginning at Block 70, a pair of hysteresis edges is determined about a given RSSI value transition at the RF receiver by sweeping RF power values transmitted from the RF source in increasing and decreasing directions, at Block 71. A relationship is determined between the relatively fine granularity RF power values and the relative coarse granularity RSSI values using the hysteresis transition edges, at Block 72. More particularly, since the RSSI transition point for the receiver 32 or 32' is located half-way between the hysteresis transition edges, the location of the actual RSSI transition relative to the TCH power level may be determined once the TCH power levels corresponding to the hysteresis transition edges are known. RF path loss for a given channel may then be determined based upon a given RSSI at a given RF power value and the determined relationship between the relatively fine granularity RF power values and the relative coarse granularity RSSI values, at Block 73, thus concluding the illustrated method (Block 74).

The scan finds the edge point as the TCH level is increased and decreased. By way of example, the coarse granularity RSSI values may be in 1.0 dB increments (i.e., the reported accuracy of the handheld receiver), while the relatively fine granularity increments may be 0.1 dB (i.e., the accuracy of the internal receiver amplifier(s)). To find the first edge, the internal amplification of the receiver may be increased in +0.1 dB increments until the edge is found. Then, a +1.0 dB step may be taken, followed by a series of −0.1 dB steps until the second edge is found. The actual RSSI value will be located half-way between the two edges. It should be noted that the direction first measured has no bearing on the results, as either edge can be found first. That is, the first hysteresis edge could be found with −0.1 dB steps, followed by a −1.0 dB step and +0.1 dB steps to find the second hysteresis edge, as will be appreciated by those skilled in the art.

Figure 8:
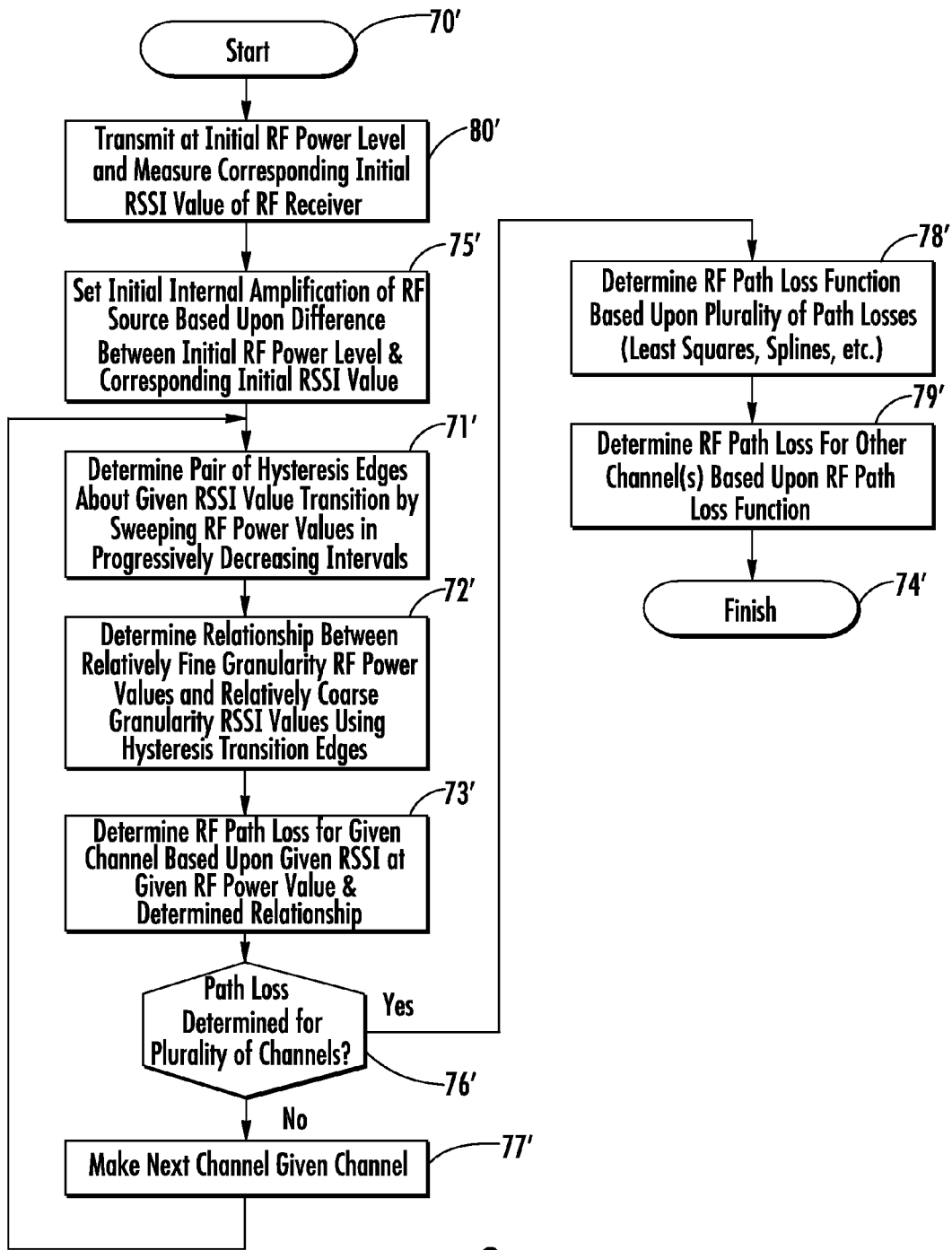

Further aspects of the test method are now described with reference to FIG. 8. The RF source 31 or 31' transmits RF power values at a relatively fine granularity, and the RF receiver 32 or 32' generates RSSI values at a relatively coarse granularity and have an unknown hysteresis about each transition between adjacent RSSI values, as noted above. A signal is transmitted from the RF source 31 or 31' at an initial RF power level, and a corresponding initial RSSI value of the RF receiver 32 or 32' is measured, at Block 80'. An initial internal amplification of the RF source 31 or 31' is set based upon a difference between the initial RF power level and the corresponding initial RSSI value, at Block 75', to thereby calibrate the RF receiver 32 or 32' with the RF source.

In addition, the method may also include repeating the three determining steps for at least one other given RF channel in the given RF frequency band to determine a plurality of RF path losses, at Blocks 76' and 77', and determining an RF path loss function based upon the plurality of RF path losses at Block 78', using a least squares algorithm, a plurality of splines, etc., as discussed further above. An RF path loss for at least one other channel within the given RF frequency band may then be determined based upon the RF path loss function, at Block 79'.

Figure 9:
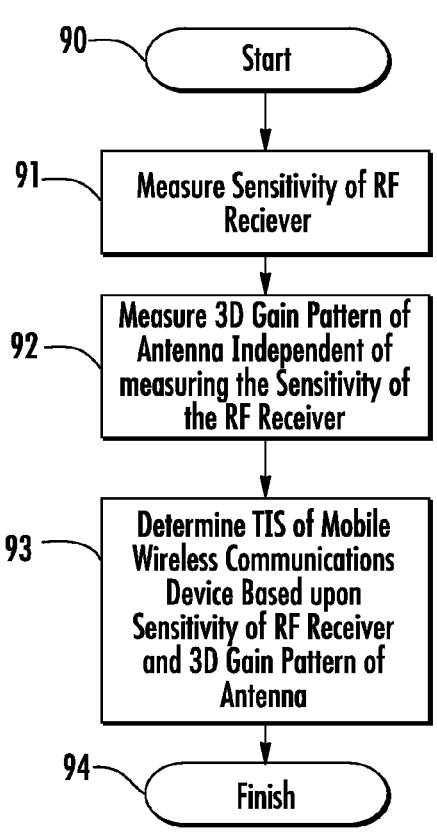
FIGS. 9 and 10 are flow diagrams of exemplary methods for determining Total Isotropic Sensitivity (TIS) of a mobile wireless communications device in accordance with an exemplary embodiment.
Figure 10:
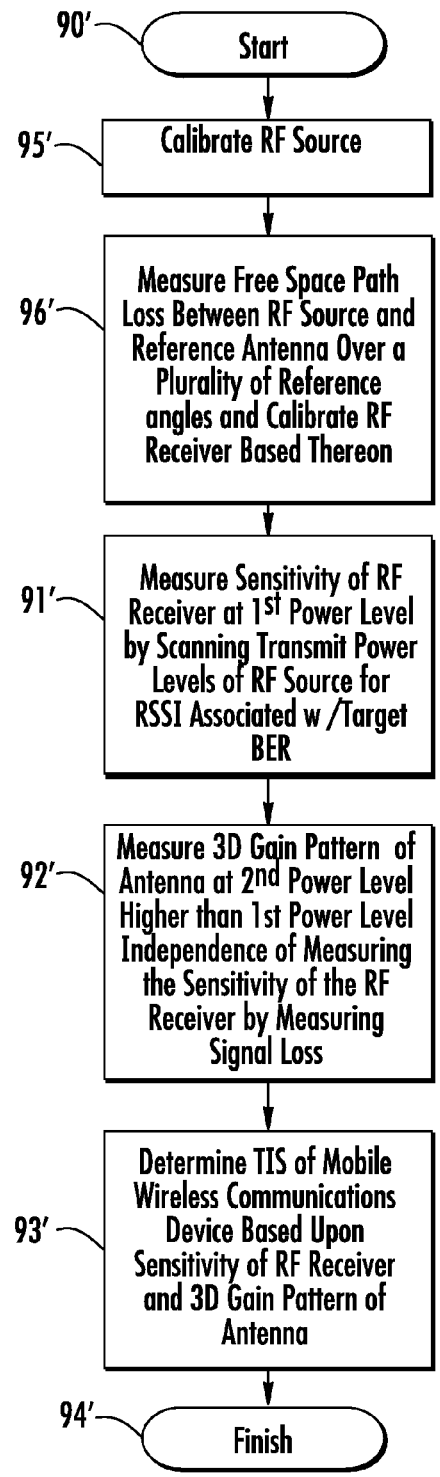
Figure 20:
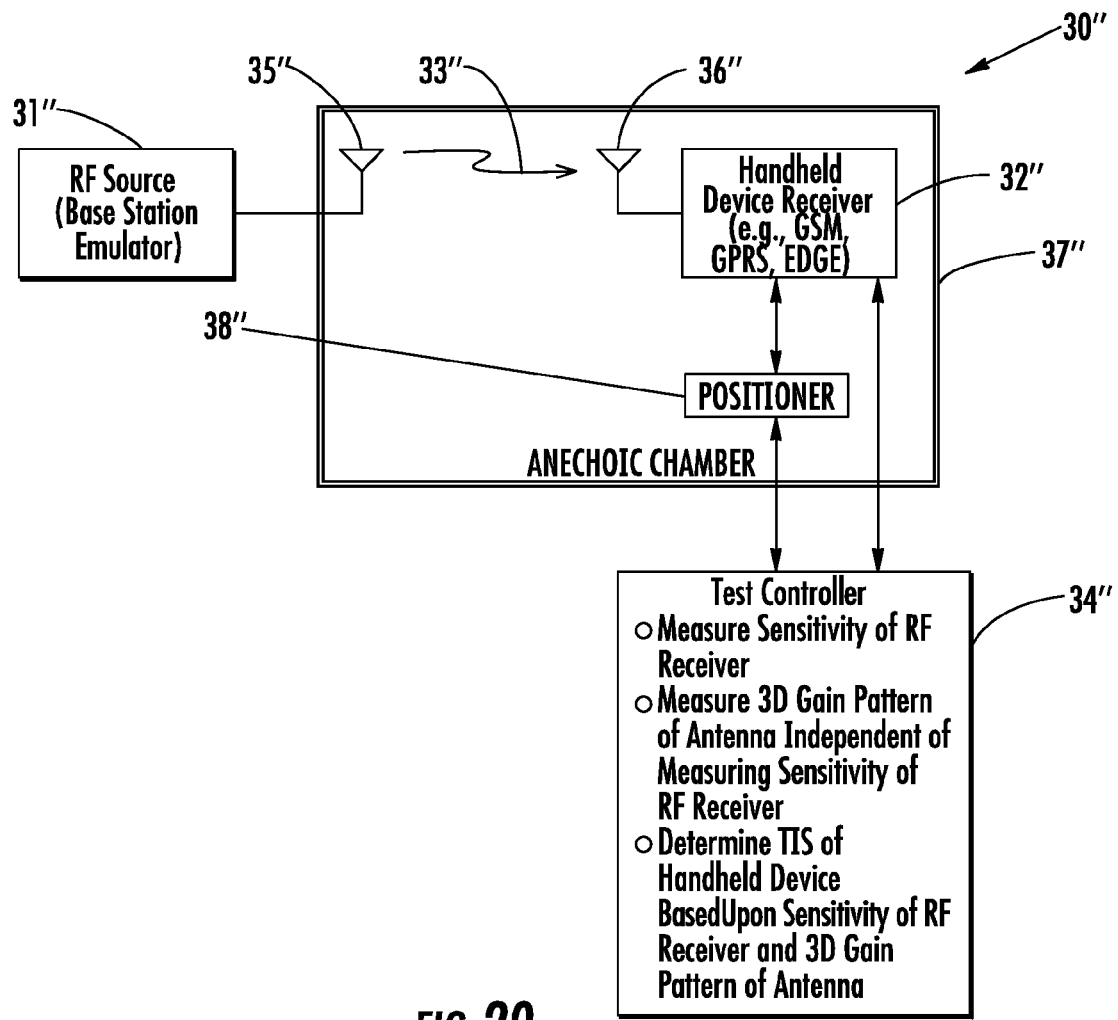
FIG. 20 is a schematic block diagram of a test system for determining TIS in accordance with an exemplary embodiment.

Turning now additionally to FIGS. 9, 10, and 20, a test system 30" and methods for determining total isotropic sensitivity (TIS) are now described. As discussed briefly above, there exists a strong interest in creating tighter specifications for handheld devices such as cellular phones, PDAs, and smart phones. There are numerous models and manufacturers that have devices operating on the same network at the same time. The performance difference will affect the coverage map of each specific device. To maintain network satisfaction, carriers choose a standard to ensure accepted devices meet the performance on their network coverage map. The Cellular Telecommunication and Internet Association (CTIA) has developed a transmitter and receiver system test methodology. Transmitter and receiver system performance is quantified by total radiated power (TRP) and TIS, respectively.

A significant difference between the TRP and TIS may result from unbalanced radio uplink and downlink performance, which in turn affects the radio coverage map of the network and power management of handheld devices. To provide good subscriber service and efficiently use network frequency resources, network carriers and regulatory organizations continue to specify tighter limits for the radio TRP and TIS. Handheld manufacturers in turn improve their designs to meet these requirements, and it becomes necessary to characterize handheld device RF characteristics with increasing levels of accuracy. Downlink path quality (i.e., TIS) is a more complicated and time consuming measurement compared to the uplink path quality (i.e., TRP). The TRP measurement is both quick and accurate to a fraction of one dB. The current CTIA-adopted TIS measurement, on the other hand, is time consuming and only targets an accuracy of about ±2.0 dB.

Sensitivity is an important parameter of a receiver and a fundamental component of TIS. As noted above, a receiver sensitivity measurement with the front end and antenna attached is called a radiated sensitivity measurement. Radiated sensitivity and receiver antenna gain together determine the radio's capability of detecting a weak signal in front of the antenna. Yet, acquiring accurate sensitivity is a time consuming process. The CTIA method searches radio sensitivity at each and every measurement angle. This results in long test times and dropped calls (mobile disconnects). Inaccuracy results from lack of direction concerning the same or absolute error calibrated method, which can result in larger accumulated system error. Transmitter and receiver characteristics are equally important in a network coverage map for a balanced link cellular network. A standard TIS measurement as specified by CTIA is performed in a standard antenna anechoic chamber 37" with a positioner 38". More particularly, the positioner 38" is a three-dimensional (3D) positioner for the great circle method, and a two-dimensional positioner is used for the conic cut method, as will be appreciated by those skilled in the art. The path loss or attenuation of a base station emulator is set to the path loss of a standard dipole antenna. That is, the theoretic isotropic antenna result can be obtained by a calibrated dipole antenna. The sensitivity is measured at every thirty degrees across a spherical pattern for the fixed dipole antenna path loss.

There are several drawbacks associated with the current CTIA TIS measurement methodology. First, sensitivity is measured at each and every angle. This is extremely time consuming, as TIS measurements take significantly longer than TRP measurements. Furthermore, a considerable change in the wireless handheld antenna radiation pattern can result in one of two circumstances which cause dropped calls. That is, either the signal at the handheld device is too low, causing a lost link, or the signal at the RF source 31" emulator end is too high, saturating the receiver terminal of the emulator. Moreover, calibrating the path loss of the dipole antenna with equipment other than a base station emulator affects the accumulated error in the range of ±1 dB. To reduce measurement time, the CTIA TIS methodology measures every thirty degrees, while TRP measurements are taken every fifteen degrees. This results in a sampling error for the TIS measurement with respect to the TRP measurement.

As described above, TIS and TRP are both of significant importance in determining the coverage map of a cellular network, and improving measurement accuracy and shortening measurement time are very important for the regulatory organizations, manufacturers and carriers. Generally speaking, beginning at Block 90, the illustrated method includes measuring the sensitivity of the RF receiver 32", at Block 91, which may be done using the techniques described above. Further, the 3D gain pattern of the antenna 36" is measured independent of the measuring of the sensitivity of the RF receiver 32", at Block 92. It should be noted that the order of the sensitivity and gain pattern measurements may be reversed, if desired. The TIS of the mobile wireless communications device is then determined based upon (i.e., by combining) the sensitivity of the RF receiver 32" and the 3D gain pattern of the antenna 36", thus concluding the method illustrated in FIG. 9 (Block 94).

CTIA acknowledges TIS measurements require both radio sensitivity and antenna gain. Applicants have determined that radiated sensitivity is substantially independent of the measurement angle, allowing antenna gain and the sensitivity to be measured separately or independently. By determining these characteristics separately, improved accuracy and reduced test time may be achieved.

System error contributes to measurement uncertainty. Equipment calibration error in the dynamic range of interest (i.e., frequency band) should preferably be eliminated by calibrating the RF source 31", at Block 95'. For a TIS measurement, a base station emulator acts as a transmitter for a dipole and handheld devices. The relatively inaccurate absolute power level of the RF source 31" may be calibrated using more accurate equipment. A power meter, for example, which has an absolute accuracy of ±0.02 dB, may be used. Moreover, a resulting power level calibration function may be generated to offset the system error over a plurality of channels in a given frequency band in a manner similar to the generation of the path loss function described above, as will be appreciated by those skilled in the art.

Following system calibration, a dipole or standard test antenna may be used to calibrate free space path loss, at Block 96'. The handheld receiver 32" power on the receiver side of the antenna 36" is reported as the RSSI. As noted above, the reporting accuracy of the RSSI is ±2 dB. Applicants have determined that this reporting error will be opposite of the sensitivity measurement error. Thus, the system error of the RSSI reporting can be eliminated or cancelled out. For a different dynamic range, the base station power calibration function may be used to calibrate out the RSSI error due to the different reporting range. For the equipment reporting accuracy of more than 0.1 dB (e.g., the reporting accuracy for the CMU 200 is ±1 dB), a path loss search as described above is used to improve the search accuracy to 0.1 dB. Again, the antenna gain measurement is based on the path loss measurement, since the path loss information provides corresponding antenna gain information. That is, the TIS information can be determined based upon the inverse nature of the RSSI reporting on device sensitivity and antenna gain as noted above, as will be appreciated by those skilled in the art.

Practically, the RF source 31" power should be at a relatively high level to reduce both measurement uncertainty of the DSP algorithm and dropped calls in the communication loop. In a radiated sensitivity measurement, the measured path loss varies from the path from base station emulator through the antenna. This difference may be calibrated by the base station power calibration function, as will be appreciated by those skilled in the art.

The use of a base station emulator to measure the RF TIS of GSM, GPRS and/or EDGE wireless handhelds, for example, for a single radio channel is a two-stage process. The first stage is the radiated sensitivity measurement in which the handheld radiated sensitivity (including path loss) is measured. The sensitivity of the RF receiver 32" is measured at a first power level by scanning transmit power levels of the RF source 31" for an RSSI value associated with a target BER, as discussed further above, at Block 91'.

The second step is the antenna gain measurement. As noted above, the current TIS methodology measures antenna and radio sensitivity simultaneously, in which antenna gain information is mixed with the BER measurement at different angles. Separating gain and sensitivity measurements allows the antenna gain pattern to be measured through a much quicker path loss search algorithm instead of a time consuming sensitivity search at each angle. The 3D gain pattern of the handheld device antenna 36" is measured at a second power level higher than the first power level by measuring signal loss using the approaches outlined above (e.g., the five-step path loss search illustrated in FIG. 15), at Block 92'. The base station emulator power curve calibration may be used not only to calibrate absolute measurement uncertainty for the standard dipole antenna in the frequency range (i.e., band) of interest, but also to calibrate the RSSI reporting error at different a reporting range.

In particular, the TIS calculation is based on the following formula:

$$TIS = \frac{4\pi P_s}{\oint [G_{\theta,EUT}(\theta, \phi) + G_{\phi,EUT}(\theta, \phi)]\sin(\theta)d\theta d\phi},$$

where $P_s$=radiated sensitivity, $G_{\theta,EUT}$=antenna radiation pattern of $\theta$ polarization, and $G_{\phi,EUT}$=antenna radiation pattern of $\phi$ polarization, as will be appreciated by those skilled in the art.

Figure 21:
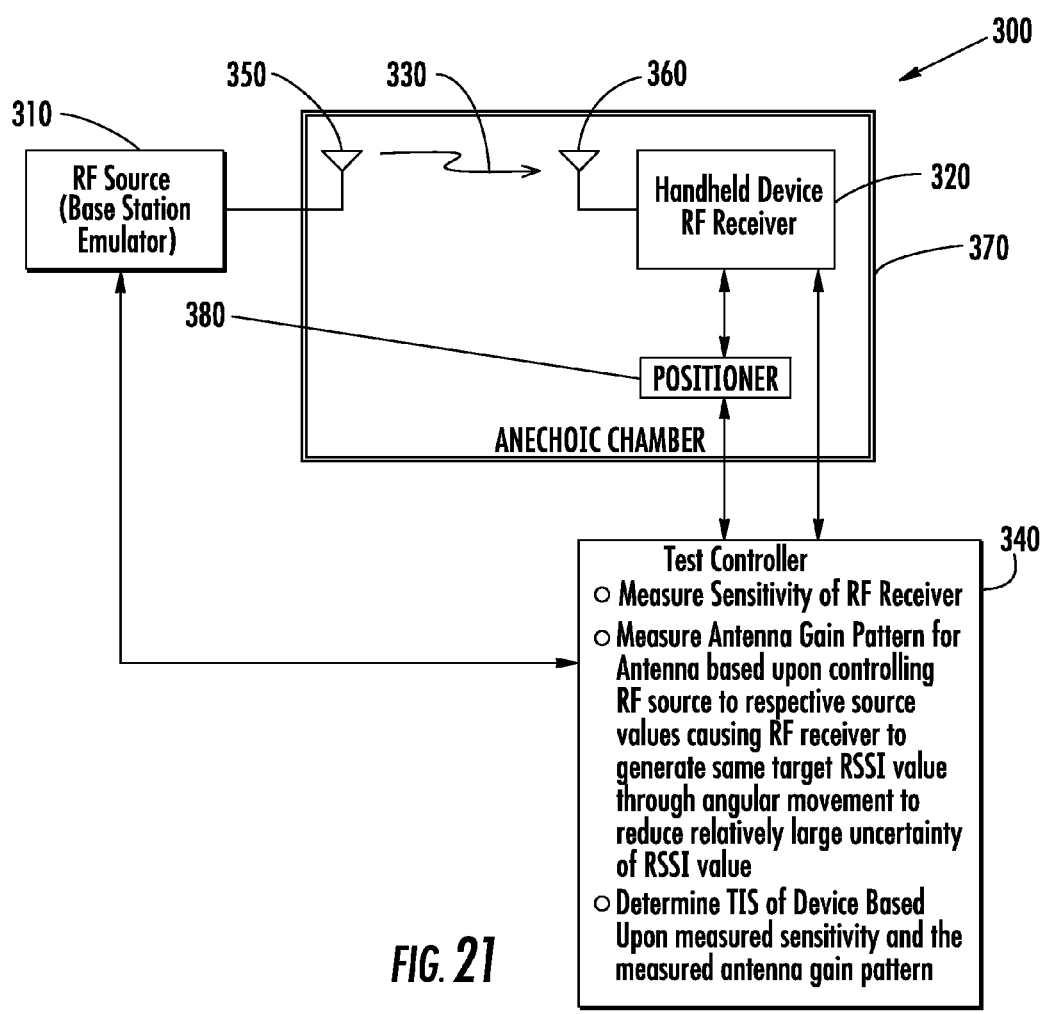
FIG. 21 is a schematic block diagram of an alternative embodiment of the TIS test system of FIG. 20.
Figure 22:
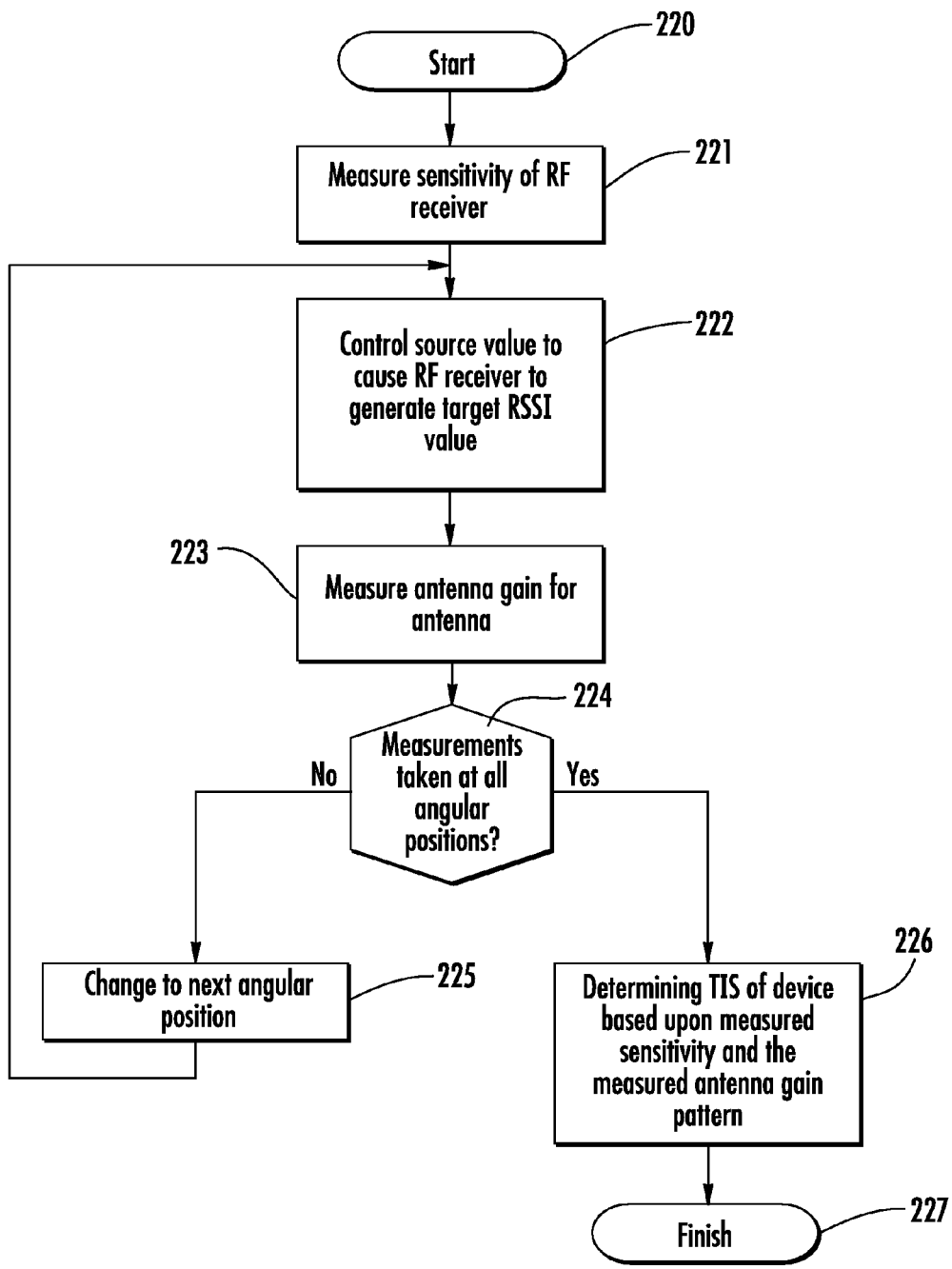
FIG. 22 is a flow diagram illustrating a TIS determination method performed by the system of FIG. 21.
Figure 23:
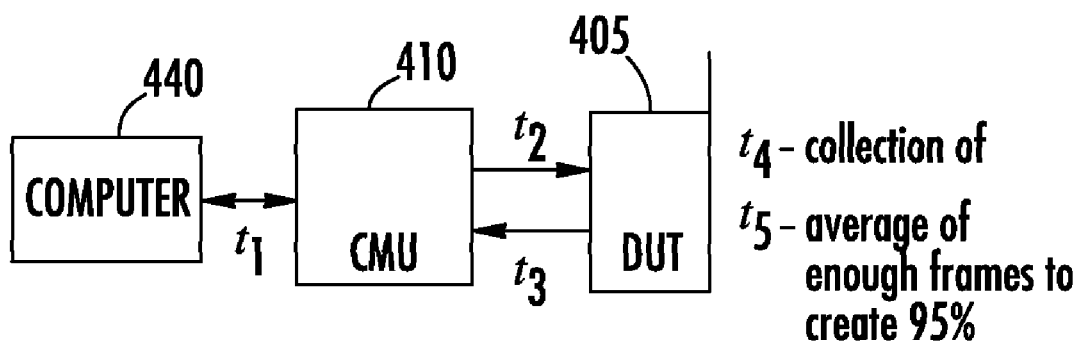
FIG. 23 is a schematic block diagram of a TIS test system illustrating factors contributing to RSSI delay.

Referring to FIGS. 21-23, an alternative test system 300 and associated methods for determining TIS are now described. Generally speaking, this alternative TIS determination approach is advantageous in that it provides for an "over-the-air" path loss calibration, in that this approach may be performed without the necessity for the conducted/radiated path loss calibration curve determination described above. Moreover, this approach may also allow for TIS determination without accounting for the hysteresis switching of the handheld device as discussed above, since this approach uses changes in amplification and/or attenuation values at the RF source to determine gain changes of the receiver, rather than relying upon changes in RSSI values reported by the receiver, as will be understood further from the following description.

As similarly described above with reference to FIG. 20, the system 300 illustratively includes an RF source 310 (e.g., a base station emulator) and associated antenna 350, a mobile wireless communications device including an antenna 360 and an RF receiver 320 coupled to the antenna. As will be appreciated by those skilled in the art, the RF receiver 320 outputs an RSSI value having a relatively large uncertainty associated therewith (e.g., ±1 dB), as opposed to the RF source 310 which is controllable to a relatively small uncertainty (e.g., ±0.1 dB), as noted above. The tests are conducted within an anechoic chamber 370, in which a positioner 380 moves the mobile wireless communications device (or just the RF receiver 320 and/or antenna 360 if only the wireless communications components are being tested without the device housing, etc.) to different angular positions. A wireless communications link 330 couples the RF source 310 to the mobile wireless communications device (i.e., the RF receiver 320), and a test controller 340 is illustratively coupled to the RF source, the positioner 380, and the RF receiver 320.

Beginning at Block 220, the illustrated TIS test method, which may be performed by the test controller 340, generally includes measuring a sensitivity of the RF receiver 320, at Block 221. The method further includes controlling the RF source to a source value (e.g., an amplification and/or attenuation value) that causes the RF receiver 320 to generate a target RSSI value, at Block 222. An exemplary target RSSI value of −80 dB is used herein, but other target RSSI values may be used in other embodiments. Generally speaking, the target RSSI value may be chosen so that the signal is received in a range where the information therein is both detectable and the wireless link 330 is less likely to be dropped or lost, which may otherwise increase test times and difficulty, as will be appreciated by those skilled in the art.

The method further illustratively includes measuring an antenna gain for the antenna 360 based upon the source value of the RF source 310 that causes the RF receiver to output the target RSSI value, at Block 223. The antenna gain measurements are repeated over a plurality of different angles or angular positions (Blocks 224-225) to thereby provide an antenna gain pattern for the antenna 360. At each angle, the source value is changed until the RF receiver 320 outputs the same target RSSI value (−80 dB in the present example), which advantageously reduces the relatively large uncertainty of the RSSI value, as will be discussed further below. Once the antenna gain measurements have been taken at all of the desired angles, the TIS of the mobile wireless communications device may be determined based upon the measured sensitivity of the RF receiver and the measured antenna gain pattern, at Block 226, thus concluding the illustrated method (Block 227).

It should be noted that certain of the above-described techniques may also be employed in the present TIS method. For example, course and fine amplification/attenuation adjustments may be used to determine the RSSI transitions (e.g., the 5-2-1-1 step approach, etc.), as noted above. Moreover, the sensitivity may be measured at a first power level, and the gain pattern may be measured at a second power level higher than the first power level, again to help reduce link dropouts during testing, and RF source calibration may also be performed as discussed above.

Further implementation details of the present TIS method will now be described. As noted above, TIS is a single value derived from both the spatially-diverse measurements of mobile antenna gain and overall sensitivity. The CTIA standard TIS methodology measures both sensitivity and antenna gain in a multi-measurement 3D pattern. At each angle the CTIA standard method measures the combined effect of antenna gain and radio sensitivity, known as effective isotropic sensitivity (EIS), at the same time. The alternative TIS measurement method discussed above advantageously measures antenna gain and sensitivity separately.

The present approach obtains antenna gain information through RSSI. The RSSI has a large reporting resolution of 1 dB. The reporting uncertainty is also relatively large. For example, the GSM system has an RSSI reporting uncertainty of ±2 dB. In accordance with the TIS measurement approach set forth herein, the following results may be advantageously be achieved: (1) separation of antenna gain and radio sensitivity measurement; (2) refined RSSI search resolution (e.g., to a possible accuracy of 0.1 dB); (3) reduced RSSI reporting uncertainty (e.g., to a possible accuracy of 0.1 dB); (4) RSSI averaging stabilization; (5) use of a TCH vs. BER channel characteristic curve for fast BER measurements; and (6) the proposed approaches work for GSM, GPRS EDGE, WCDMA/UMTS and other RSSI reporting protocols.

Sensitivity is measured at a given angle. Antenna gain is measured by comparing the base station transmit power and the reported mobile RSSI. By noting the RSSI changes across different angles, a spherical representation of antenna gain variation is compiled. The RSSI-based 3D antenna gain measurements provide a relative (i.e., not absolute) set of values. RSSI is directly related to the base station transmit levels, associated path losses, and antenna gain. Free space path loss is measured between the base station's dual polarized source antenna and a standard dipole antenna. Separating free space path loss provides the absolute, instead of relative, antenna gain.

By definition, RSSI has an unacceptable maximum error of ±2 dB. However, antenna gain and sensitivity, when derived from RSSI, are affected inversely. If RSSI reports 1 dB high, antenna gain reports 1 dB better (higher) but sensitivity reports 1 dB worse (higher). Thus, the RSSI reporting error has no effect on the proposed TIS methodology. To reduce the measurement uncertainty, RSSI reporting stability is important. The RSSI settling time is mainly dependent on device DSP code, protocol and traffic channel level, as seen in FIG. 23. Here, a device under test 405 is shown along with a CMU base station emulator 410 and a computer 440 as the test controller, as well as the delays $t_1$-$t_5$ associated therewith. Generally speaking, the RSSI settling time does not change for a narrow RSSI value spread. Then it is efficient that the desired settling time is searched at the beginning of the program and applied to all of the RSSI measurements of the 3D pattern.

The error associated with RSSI measurements (i.e., ±2 dB) inversely affects antenna gain and sensitivity, the two components of EIS. Here we are showing a system error cancellation case, i.e., calibration absolute antenna gain at the sensitivity measurement stage in one angle. In systems with a transmit power $P_t$ (which is the sum of the base station emulator transmit power $P_o$ and the amplification $P_a$ required to overcome path loss to the receiver), a free space path loss $P_s$, a dipole-calibrated path loss $P_d$, and an antenna gain G, the power $P_{in}$ received by the radio is shown in equation (1). The difference between Pin and RSSI is represented by an error ΔR (equation (2)).

$$P_{in}=P_o+P_a-P_s+G; \text{ and} \quad (1)$$

$$P_{in}=RSSI \pm \Delta R. \quad (2)$$

Thus, $$P_{in}=P_t-P_s+G. \quad (3)$$

Gain can therefore be shown to be related to RSSI and error by setting $P_o$ and RSSI to match, i.e., $P_o$=RSSI. From equations (2) and (3):

$$RSSI \pm \Delta R = RSSI + P_a - P_s + G, \text{ thus}$$

$$G = P_s - P_a \pm \Delta R. \qquad (4)$$

A dipole antenna is typically used to calibrate path loss, where:

$$P_s = P_d - 2.15. \qquad (5)$$

By correlating $P_a$ to $P_d$, i.e., $P_a = P_d$, we can correlate the measured gain to the overall dipole path loss, as opposed to relative RSSI readings.

$$P_a = P_d = P_s - 2.15. \qquad (6)$$

By using this new value in equation (3), $P_{in}$ and thus RSSI change as they correspond to $P_d$, since all other settings are held constant. The transmit power $P_o$ is held constant. By using equations (2), (3) and (5), it can be shown how the gain G in dB is related to RSSI and the error:

$$P_{ind} = P_o + (P_s + 2.15) - P_s + G;$$

$$P_{ind} = P_o + 2.15 + G;$$

$$RSSI_d \pm \Delta R_d = RSSI + G + 2.15; \text{ thus}$$

$$G = (RSSId - RSSI) \pm \Delta R_d - 2.15 \qquad (7)$$

Sensitivity is defined as a lowest possible value of $P_{in}$ for which the BER meets the specifications (usually 2.44%, as noted above). It can be searched by reducing the transmit power to $P_o + \Delta P_{min}$, thus:

$$P_{in|min} = Po + \Delta P_{min} + P_a - P_s + G, \text{ thus}$$

$$P_{in|min} = Po + \Delta P_{min} + G + 2.15. \qquad (8)$$

Thus, EIS, the difference between sensitivity S and gain G, shows that there exists no RSSI error due to a cancellation of gain terms. Thus, TIS, an integration of EIS terms across a 3D spherical plotting of EIS values, is independent of RSSI error. However, this relies on the accuracy of the BSE power output stage, due to the change in power ($\Delta P_{min}$), which can be calibrated out as follows:

$$EIS = P_{in|min} - G; \text{ so from eq.} \qquad (8)$$

$$EIS = Po + \Delta P_{min} + 2.15. \qquad (9)$$

TIS determines the downlink performance of the terminal. TIS in dB is equal to radio radiated sensitivity minus antenna gain:

$$TIS = P_{in|min} - G_r; \text{ where} \qquad (10)$$

$$G_r = \frac{1}{4\pi} \int_0^{2\pi} \int_0^{\pi} G(\theta, \phi) \sin\theta \, d\theta \, d\phi, \qquad (11)$$

and $G(\theta, \phi)$ is the receive antenna power pattern. Equation (10) thus provides the calculation method for TIS, as will be appreciated by those skilled in the art.

In summary, RSSI is a relative measurement. In order to obtain TIS, measurements need to be taken with regard to an isotropic reference. In practice, a dipole antenna has been used as a standard reference, and the difference in terms of antenna gain is 2.15 dB in favor of the dipole. Using a dipole as a reference, 2.15 dB is subtracted to provide an isotropic reference. This reference may be obtained by various approaches, such as an antenna gain (RSSI) measurement, radio sensitivity measurement, or by calculation, as will be appreciated by those skilled in the art.

Regarding system error elimination in the antenna gain, the present approach obtains antenna gain information by "fixing" a target RSSI value for each measurement angle, and changing Po+Pa (i.e., changing the base station emulator amplification/attenuation) to obtain this fixed target RSSI value at the receiver. Fixing the RSSI associates the measurement system error with the communication emulator power source accuracy, which has a much better accuracy (i.e., ±0.1 dB). The emulator is generally calibrated once a year, although other periods may also be used. For enhanced accuracy, the system may be calibrated with accurate instruments such as a power meters, for example.

Figure 24:
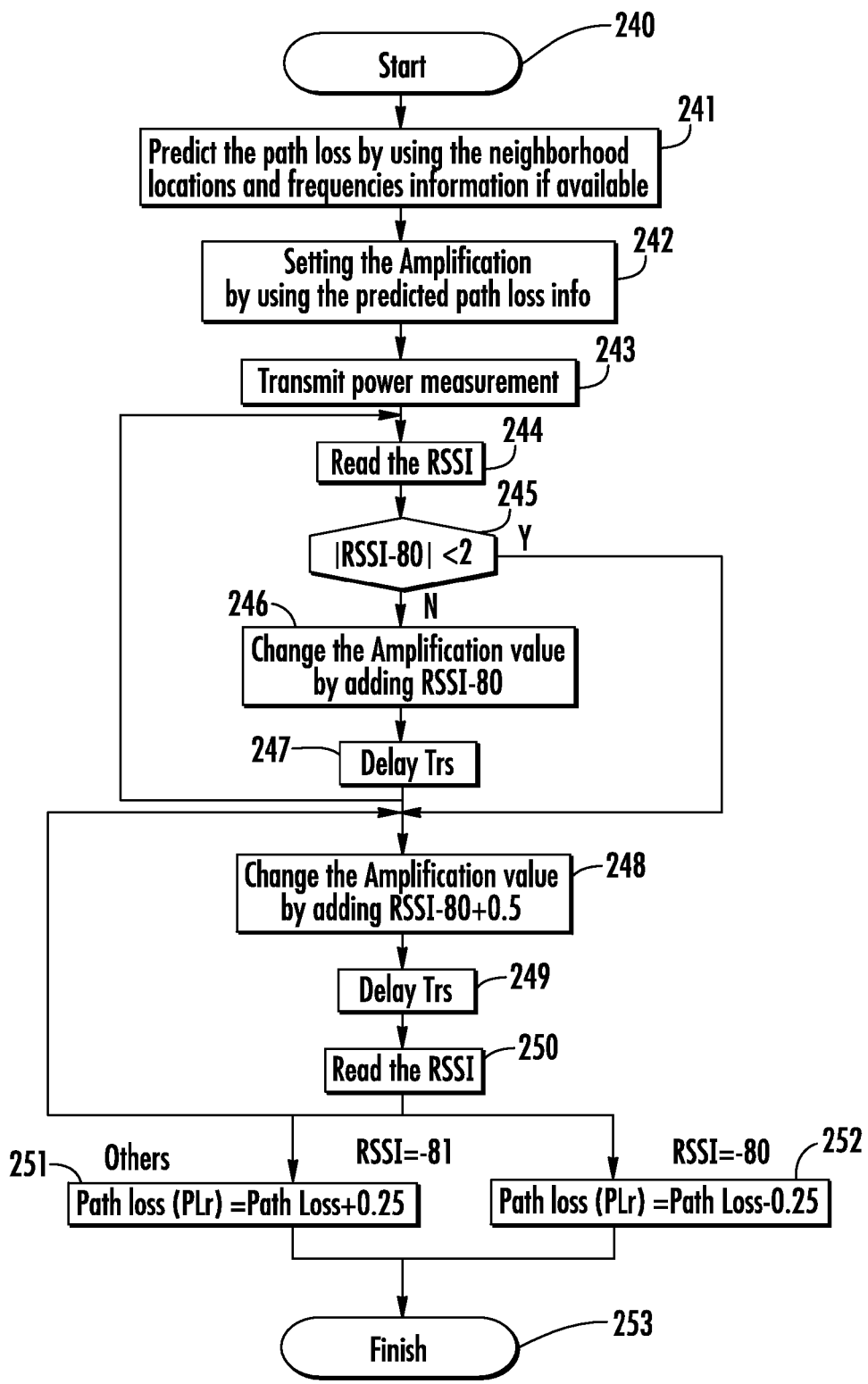
FIG. 24 is a flow diagram of a path loss search measurement method for use in the TIS determination in accordance with one exemplary embodiment.
Figure 25A:
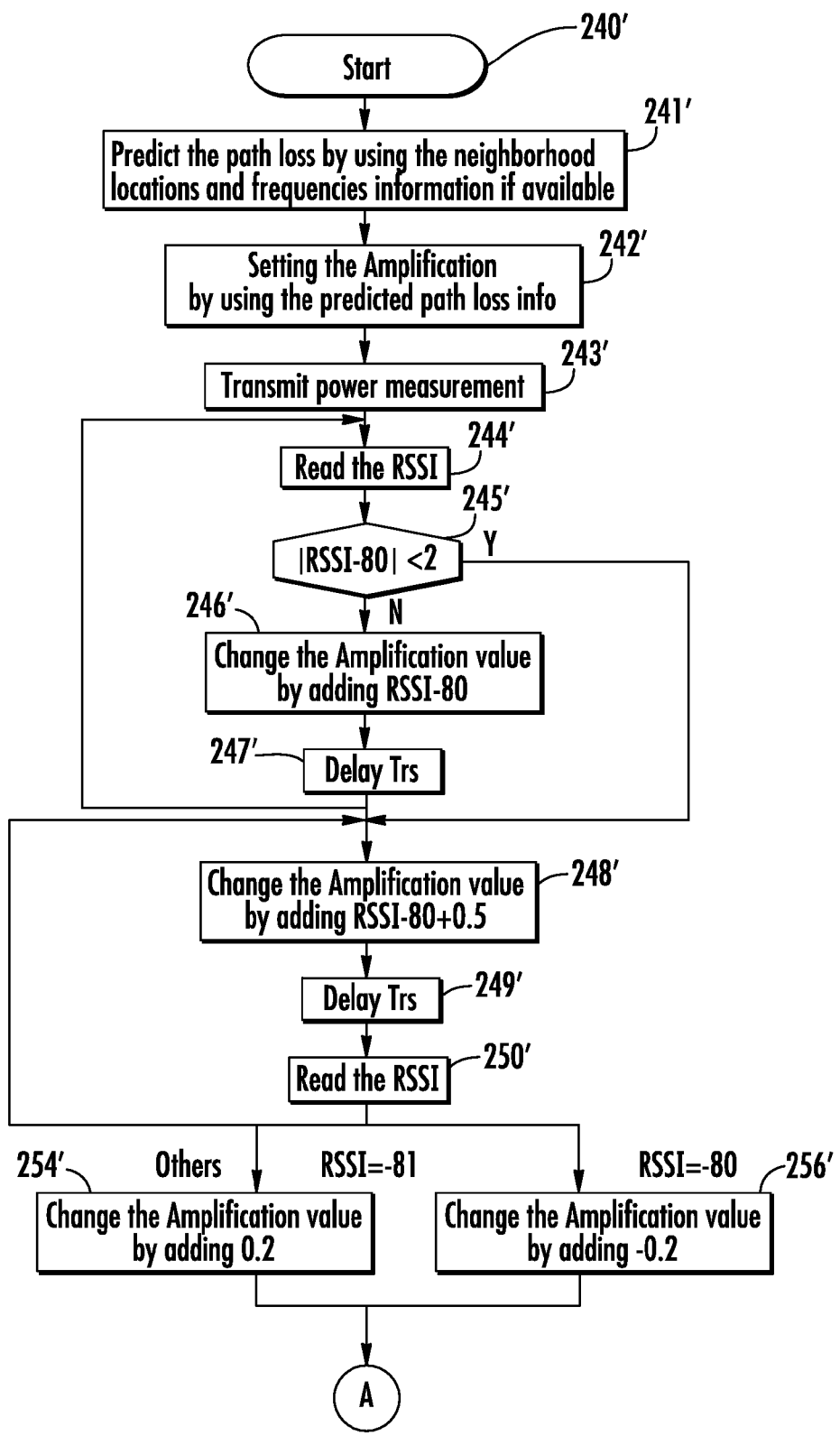
FIG. 25 (which is shown in parts A and B on separate pages) is a flow diagram of an alternative embodiment of the path loss search measurement method of FIG. 24.
Figure 25B:
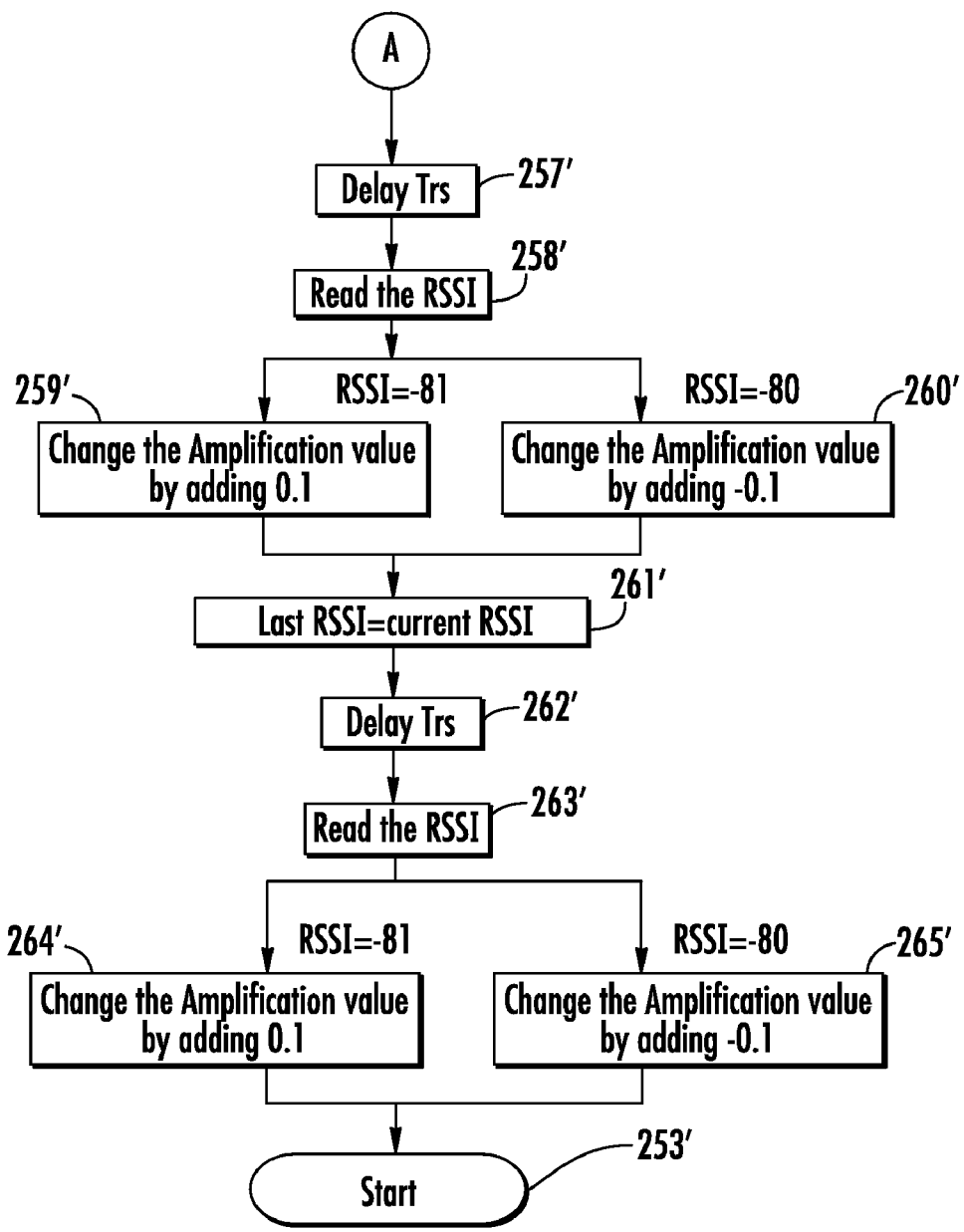

An exemplary path loss antenna gain measurement approach for use with the above-described TIS determinations is shown in FIG. 24. Beginning at Block 240, path loss is predicted by using neighborhood location and frequency information (if available), as discussed above (Block 241). Next, the amplification/attenuation of the base station emulator 310 is set by using the predicted path loss information, at Block 242, and the power measurement test signal is transmitted, at Block 243. The RSSI is then read from the receiver 320, at Block 244, and if the delta between the RSSI and the target RSSI value (e.g., −80 dB) is not within a desired range (e.g., ±2 dB), at Block 245, then the amplification/attenuation value is changed by the amount of the delta (Block 246) and a delay (Trs) to allow for settling is taken (Block 247) before the next RSSI reading.

The steps illustrated at Blocks 244-247 are repeated until the RSSI is within the desired range, at which point the amplification/attenuation value is changed by adding (RSSI−80 dB+0.5 dB) (Block 248), followed by another settling delay (Block 249), and another RSSI reading, at Block 250. If the RSSI is not −80 dB or −81 dB, then the steps illustrated at Blocks 248-250 are repeated. If the RSSI is equal to −81 dB, then the path loss PLr is set to the current value plus 0.25 dB, at Block 251, and if it is equal to −80 dB then PLr is set to the current value minus 0.25 dB, at Block 252, which concludes the illustrated path loss measurement method (Block 253).

A similar approach utilizing the above-described 5-2-1-1 stepping approach is illustrated in FIG. 24. After the step illustrated at Block 250', if the RSSI is not −80 dB or −81 dB, then the steps illustrated at Blocks 248'-250' are repeated. If the RSSI is equal to −81 dB, then the amplification/attenuation value is changed by adding 0.2 dB to the amplification/attenuation of the base station emulator (Block 254'), and subtracting 0.2 dB if the reported RSSI is equal to −80 dB (Block 256'). Another settling delay and reading of the RSSI are then taken, at Blocks 257'-258'. If the RSSI is equal to −81 dB, then the amplification/attenuation value is changed by adding 0.1 dB to the amplification/attenuation of the base station emulator (Block 259'), and subtracting 0.1 dB if the reported RSSI is equal to −80 dB (Block 260').

The last measured RSSI value is then set to the current RSSI value, at Block 261', followed by a settling delay (Block 262'), and the RSSI is read once again at the receiver, at Block 263'. If the RSSI is equal to −81 dB, then the amplification/attenuation value is again changed by adding 0.1 dB to the amplification/attenuation of the base station emulator (Block 264'), and subtracting 0.1 dB if the reported RSSI is equal to −80 dB (Block 265').

Many modifications and other embodiments will come to the mind of one skilled in the art having the benefit of the teachings presented in the foregoing descriptions and the associated drawings. Therefore, it is understood that various That which is claimed is:

1. A test method for determining total isotropic sensitivity (TIS) of a mobile wireless communications device using a radio frequency (RF) source controllable to a plurality of source values having a relatively small uncertainty associated therewith, the mobile wireless communications device comprising an antenna, a radio frequency (RF) receiver coupled to the antenna and outputting a received signal strength indicator (RSSI) value having a relatively large uncertainty associated therewith, the method comprising:
    measuring a sensitivity of the RF receiver;
    measuring an antenna gain pattern for the antenna based upon controlling the RF source to respective source values causing the RF receiver to generate a same target RSSI value as the RF source and wireless communications device are angularly moved relative to one another to thereby reduce the relatively large uncertainty of the RSSI value; and
    determining the TIS of the mobile wireless communications device based upon the measured sensitivity of the RF receiver and the measured antenna gain pattern.

2. The method of claim 1 wherein the source values comprise amplification values.

3. The method of claim 2 wherein measuring the antenna gain pattern for the antenna comprises controlling the RF source based upon at least one course amplification adjustment and at least one fine amplification adjustment to determine an RSSI transition.

4. The method of claim 1 wherein measuring the sensitivity comprises measuring the sensitivity of the RF receiver at a first power level, and wherein measuring the gain pattern comprises measuring the gain pattern of the antenna at a second power level higher than the first power level.

5. The method of claim 1 further comprising calibrating the RF source.

6. The method of claim 1 wherein determining the receiver sensitivity comprises scanning transmit power levels of the RF source for a received signal strength indicator (RSSI) associated with a target bit error rate (BER).

7. The method of claim 1 further comprising measuring a free space path loss between the RF source and a reference antenna and calibrating the RF receiver based thereon.

8. The method of claim 7 wherein the reference antenna comprises a dipole antenna.

9. The method of claim 1 wherein the measuring steps are performed in an anechoic RF chamber.

10. A test method for determining total isotropic sensitivity (TIS) of a mobile wireless communications device using a radio frequency (RF) source, the mobile wireless communications device comprising an antenna, and a radio frequency (RF) receiver coupled to the antenna, the method comprising:
    measuring a sensitivity of the RF receiver;
    measuring an antenna gain pattern for the antenna based upon controlling the RF source to respective source values causing the RF receiver to generate a same target RSSI value as the RF source and wireless communications device are angularly moved relative to one another; and
    determining the TIS of the mobile wireless communications device based upon the measured sensitivity of the RF receiver and the measured antenna gain pattern.

11. The method of claim 10 wherein the source values comprise amplification values.

12. The method of claim 11 wherein measuring the antenna gain pattern for the antenna comprises controlling the RF source based upon at least one course amplification adjustment and at least one fine amplification adjustment to determine an RSSI transition.

13. The method of claim 10 wherein measuring the sensitivity comprises measuring the sensitivity of the RF receiver at a first power level, and wherein measuring the gain pattern comprises measuring the gain pattern of the antenna at a second power level higher than the first power level.

14. The method of claim 10 further comprising calibrating the RF source.

15. The method of claim 10 wherein determining the receiver sensitivity comprises scanning transmit power levels of the RF source for a received signal strength indicator (RSSI) associated with a target bit error rate (BER).

16. The method of claim 10 further comprising measuring a free space path loss between the RF source and a reference antenna and calibrating the RF receiver based thereon.

17. A test system for determining total isotropic sensitivity (TIS) of a mobile wireless communications device comprising an antenna and a radio frequency (RF) receiver coupled to the antenna and outputting a received signal strength indicator (RSSI) value, the system comprising:
    a radio frequency (RF) source controllable to a plurality of source values;
    a wireless communications link coupling said RF source to the mobile wireless communications device; and
    a test controller cooperating with said RF source and the RF receiver for
        measuring a sensitivity of the RF receiver,
        measuring an antenna gain pattern for the antenna based upon controlling the RF source to respective source values causing the RF receiver to generate a same target RSSI value as the RF source and wireless communications device are angularly moved relative to one another, and
        determining the TIS of the mobile wireless communications device based upon the measured sensitivity of the RF receiver and the measured antenna gain pattern.

18. The system of claim 17 wherein the source values comprise amplification values.

19. The system of claim 18 wherein measuring the antenna gain pattern for the antenna comprises controlling said RF source based upon at least one course amplification adjustment and at least one fine amplification adjustment to determine an RSSI transition.

20. The system of claim 17 wherein measuring the sensitivity comprises measuring the sensitivity of the RF receiver at a first power level, and wherein measuring the gain pattern comprises measuring the gain pattern of the antenna at a second power level higher than the first power level.

21. The system of claim 17 wherein determining the receiver sensitivity comprises scanning transmit power levels of the RF source for a received signal strength indicator (RSSI) associated with a target bit error rate (BER).

* * * * *